(12) United States Patent
Kumagai et al.

(10) Patent No.: US 10,458,016 B2
(45) Date of Patent: *Oct. 29, 2019

(54) METHOD FOR FORMING A PROTECTIVE FILM

(71) Applicant: Tokyo Electron Limited, Tokyo (JP)

(72) Inventors: Takeshi Kumagai, Iwate (JP); Yutaka Takahashi, Iwate (JP); Chihhsiang Hsiao, Iwate (JP); Atsushi Endo, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/382,901

(22) Filed: Dec. 19, 2016

(65) Prior Publication Data

US 2017/0182514 A1    Jun. 29, 2017

(30) Foreign Application Priority Data

Dec. 25, 2015  (JP) .................................. 2015-253136
Oct. 7, 2016   (JP) .................................. 2016-199333

(51) Int. Cl.
*C23C 16/40*      (2006.01)
*C23C 16/04*      (2006.01)
(Continued)

(52) U.S. Cl.
CPC .............. *C23C 16/04* (2013.01); *C23C 16/18* (2013.01); *C23C 16/405* (2013.01);
(Continued)

(58) Field of Classification Search
CPC .......... C23C 16/06; C23C 16/16; C23C 16/18; C23C 16/20; C23C 16/308;
(Continued)

(56) References Cited

U.S. PATENT DOCUMENTS 3,328,124 A * 6/1967 Mays ..................... A01N 25/08
                                              106/426
3,328,125 A * 6/1967 Mays ..................... A01N 25/08
                                              106/409

(Continued)

FOREIGN PATENT DOCUMENTS

JP    2007-042884    2/2007
JP    2009-212303    9/2009

(Continued)

*Primary Examiner* — Marianne L Padgett
(74) *Attorney, Agent, or Firm* — IPUSA, PLLC

(57) ABSTRACT

A method for forming a protective film is provided. In the method, a source gas containing an organic metal gas or an organic semi-metal gas is supplied to a substrate having a plurality of recessed shapes formed in a surface so as to cause the source gas to adsorb on the surface of the substrate including the plurality of recessed shapes. Then, an oxidation gas is supplied to the surface of the substrate including the plurality of recessed shapes to oxidize the source gas adsorbed on the surface of the substrate, thereby depositing an oxidation film of the organic metal or the organic semi-metal on a flat area between the plurality of recessed shapes. Supplying the source gas to the substrate and supplying the oxidation gas to the substrate are repeated at a rate in a range of 90 to 300 cycles per minute.

8 Claims, 14 Drawing Sheets

(51) Int. Cl.
*C23C 16/18* (2006.01)
*C23C 16/455* (2006.01)
*C23C 16/458* (2006.01)
*H01L 21/02* (2006.01)
*H01L 21/033* (2006.01)
*H01J 37/32* (2006.01)

(52) U.S. Cl.
CPC ...... *C23C 16/4554* (2013.01); *C23C 16/4584* (2013.01); *C23C 16/45551* (2013.01); *H01J 37/321* (2013.01); *H01J 37/3244* (2013.01); *H01J 37/32366* (2013.01); *H01J 37/32431* (2013.01); *H01J 37/32651* (2013.01); *H01J 37/32715* (2013.01); *H01J 37/32779* (2013.01); *H01L 21/0228* (2013.01); *H01L 21/02186* (2013.01); *H01L 21/0334* (2013.01)

(58) Field of Classification Search
CPC ..... C23C 16/40–409; C23C 16/45525–45555; C23C 16/405; C23C 16/45527; C23C 16/45548; C23C 16/45551; C23C 16/45553
USPC ..... 427/96.2–96.6, 255.19, 255.31–255.393, 427/255.4, 255.5, 255.7; 438/785, 782
See application file for complete search history.

(56) References Cited

U.S. PATENT DOCUMENTS

| | | | |
|---|---|---|---|
| 5,594,278 A * | 1/1997 | Uchiyama | H01L 23/5226 257/751 |
| 7,981,815 B2 | 7/2011 | Miya et al. | |
| 8,835,332 B2 * | 9/2014 | Kato | H01L 21/30 438/787 |
| 9,023,738 B2 * | 5/2015 | Kato | H01L 21/30 438/787 |
| 10,170,300 B1 * | 1/2019 | Tsukazawa | H01L 21/02612 |
| 2004/0208994 A1 | 10/2004 | Harkonen et al. | |
| 2005/0032372 A1 | 2/2005 | Ko et al. | |
| 2006/0063346 A1 | 3/2006 | Lee et al. | |
| 2007/0232044 A1 * | 10/2007 | Chowdhury | C23C 18/31 438/597 |
| 2007/0269595 A1 * | 11/2007 | Harkonen | C23C 16/0272 427/248.1 |
| 2008/0242097 A1 | 10/2008 | Boescke et al. | |
| 2009/0053906 A1 | 2/2009 | Miya et al. | |
| 2010/0055312 A1 | 3/2010 | Kato et al. | |
| 2010/0330269 A1 * | 12/2010 | Chen | C23C 16/405 427/123 |
| 2011/0104395 A1 * | 5/2011 | Kumagai | C23C 16/402 427/554 |
| 2011/0151136 A1 * | 6/2011 | Rui | C23C 16/02 427/539 |
| 2011/0236598 A1 * | 9/2011 | Kumagai | C23C 16/45536 427/569 |
| 2012/0175751 A1 * | 7/2012 | Gatineau | C23C 16/34 257/632 |
| 2013/0164942 A1 * | 6/2013 | Kato | H01L 21/30 438/758 |
| 2013/0203267 A1 * | 8/2013 | Pomarede | H01L 21/02148 438/778 |
| 2013/0323435 A1 * | 12/2013 | Xiao | C09D 1/00 427/579 |
| 2015/0243739 A1 * | 8/2015 | Chen | H01L 29/7851 257/623 |
| 2015/0315705 A1 * | 11/2015 | Kumagai | C23C 16/45544 216/67 |

FOREIGN PATENT DOCUMENTS

| | | |
|---|---|---|
| JP | 2010-103242 | 5/2010 |
| JP | 2011-054742 | 3/2011 |
| JP | 2011-216862 | 10/2011 |
| JP | 2017-120884 | 7/2017 |
| WO | 2008/010546 | 1/2008 |

* cited by examiner

FIG.10

| COLLOQUIAL TERM | MOLECULAR FORMULA | NAME |
|---|---|---|
| TMA | $(CH_3)_3Al$ | Trimethylaluminium |
| ZyALD (Trademark) | $C_{11}H_{23}N_3Zr$ | Tris(dimethylamino) cyclopentadienylziroconium |
| TiMCTA | $CH_3C_5H_4Ti[N(CH_3)_2]_3$ | Methylcyclopentadiene titanium trisdimethylamide |
| 3DMASi | $[(CH_3)_2N]_3SiH$ | Tris(dimethylamino)silane |
| TEMAZ | $[CH_3CH_2(CH_3)N]_4Zr$ | Tetrakis(N-ethyl-N-methylamino) zirconium |
| TEMAH | $[CH_3CH_2(CH_3)N]_4Hf$ | Tetrakis(N-ethyl-N-methylamino) hafnium |
| TDMAH | $Hf[N(CH_3)_2]_4$ | Tetrakis(dimethylamino)hafnium |
| TiMCTA | $CH_3C_5H_4Ti[N(CH_3)_2]_3$ | Methylcyclopentadienyl tris(dimethylamino)titanium |
| TDMAT | $[(CH_3)_2N]_4Ti$ | Tetrakis(N, N-dimethylamino)titanium |

METHOD FOR FORMING A PROTECTIVE FILM

CROSS-REFERENCE TO RELATED APPLICATION

The present application is based on Japanese Priority Application No. 2015-253136 filed on Dec. 25, 2015, and Japanese Priority Application No. 2016-199333 filed on Oct. 7, 2016, the entire contents of which are hereby incorporated herein by reference.

BACKGROUND OF THE INVENTION

1. Field of the Invention

The present invention relates to a method for forming a protective film.

2. Description of the Related Art

Conventionally, as disclosed in Japanese Laid-Open Patent Application Publication No. 2010-103242, a method for manufacturing a semiconductor device is known. In the method, a LOCOS (LOCal Oxidation of Silicon) oxide film is formed on a surface of a silicon layer, and then an impurity region is formed by implanting impurity atoms into the silicon layer. Next, a SiN layer and a $SiO_2$ layer are stacked on the silicon layer, and openings are selectively formed in the SiN layer and the $SiO_2$ layer by photolithography and etching. Finally, trenches are formed in the LOCOS oxide film and the silicon layer by using the SiN layer and the $SiO_2$ layer having the openings as a mask.

However, along with development of miniaturization in recent years, it has become difficult to accurately form a contact hole at a desired target position. Moreover, it has become difficult to make a mask to form the contact hole having the same size as the target. To solve these problems, it is necessary to form a protective film such that an area other than a desired portion is not etched even if an arraignment error occurs. However, it is very difficult to regionally leave the protective film due to a limitation of lithography accuracy. To solve these problems, it is desired to provide a method for forming a protective film in a self-aligning manner.

SUMMARY OF THE INVENTION

The present invention is made in light of the above problems, and provides a method for forming a protective film at a desired position in a self-aligning manner.

According to an embodiment, there is provided a method for forming a protective film. In the method, a source gas containing an organic metal gas or an organic semi-metal gas is supplied to a substrate having a plurality of recessed shapes formed in a surface so as to cause the source gas to adsorb on the surface of the substrate including the plurality of recessed shapes. Then, an oxidation gas is supplied to the surface of the substrate including the plurality of recessed shapes to oxidize the source gas adsorbed on the surface of the substrate, thereby depositing an oxidation film of the organic metal or the organic semi-metal on a flat area between the plurality of recessed shapes. Supplying the source gas to the substrate and supplying the oxidation gas to the substrate are repeated at a rate in a range of 90 to 300 cycles per minute.

Additional objects and advantages of the embodiments are set forth in part in the description which follows, and in part will become obvious from the description, or may be learned by practice of the invention. The objects and advantages of the invention will be realized and attained by means of the elements and combinations particularly pointed out in the appended claims. It is to be understood that both the foregoing general description and the following detailed description are exemplary and explanatory and are not restrictive of the invention as claimed.

BRIEF DESCRIPTION OF THE DRAWINGS

FIG. 10 is a table illustrating example s of source gases to which the method for forming the protective film according to an embodiment of the present invention can be applied;

DETAILED DESCRIPTION OF THE PREFERRED EMBODIMENTS

Embodiments of the present invention are described below with reference to accompanying drawings.

[Film Deposition Apparatus]

To begin with, a film deposition apparatus preferable to implement a method for forming a protective film according to an embodiment of the present invention is described below. The method for forming the protective film according to the embodiments of the present invention can be implemented by a variety of film deposition apparatuses and structures of the film deposition apparatuses are not limited to a specific structure, as long as kinds of gases to be supplied to a substrate can be rapidly switched. Here, an example of the film deposition apparatus capable of performing the film deposition process by rapidly switching the kinds of gases to be supplied to the substrate, is described below.

Figure 1:
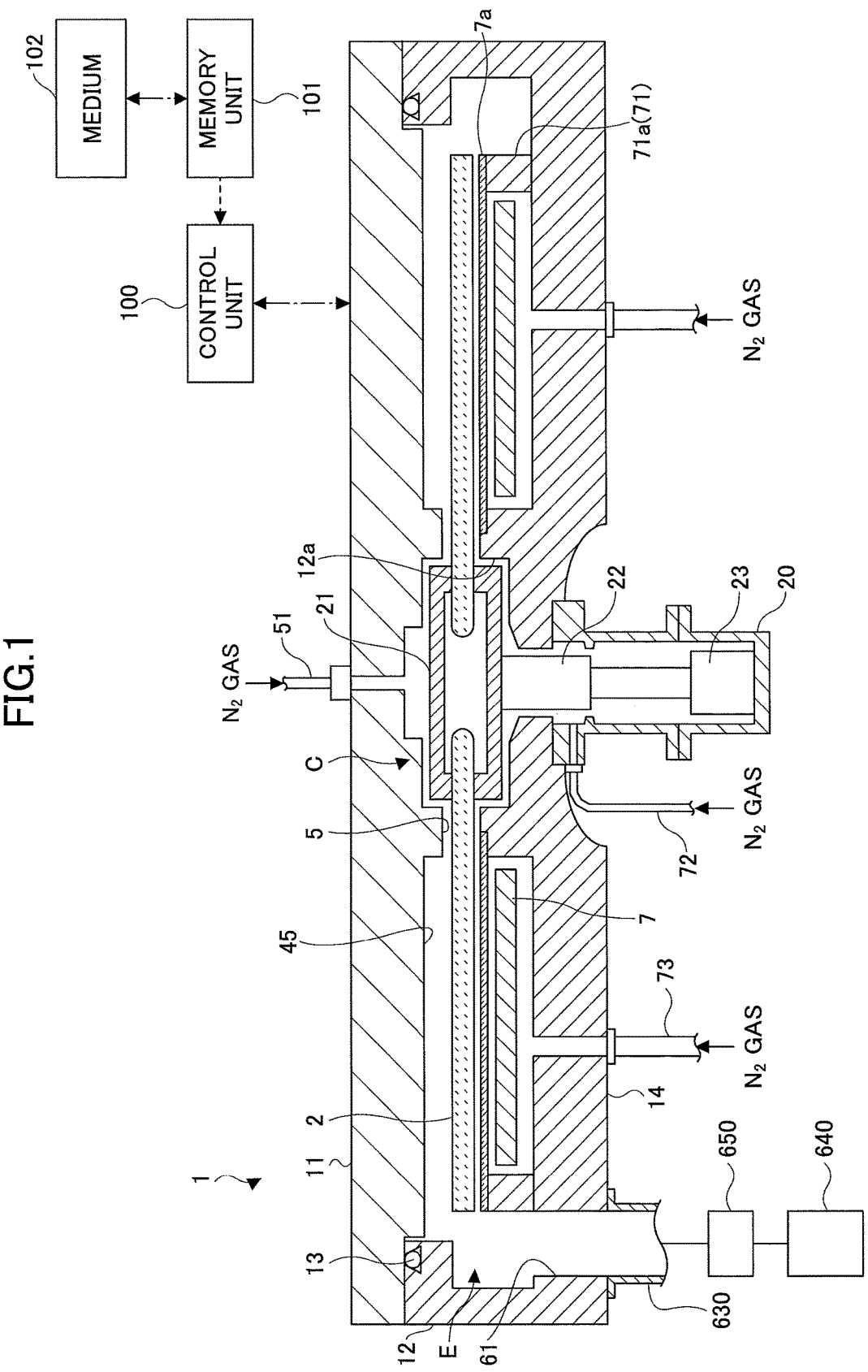
FIG. 1 a schematic cross-sectional view illustrating an example of a film deposition apparatus preferable to perform a method for forming a protective film according to an embodiment of the present invention.
Figure 2:
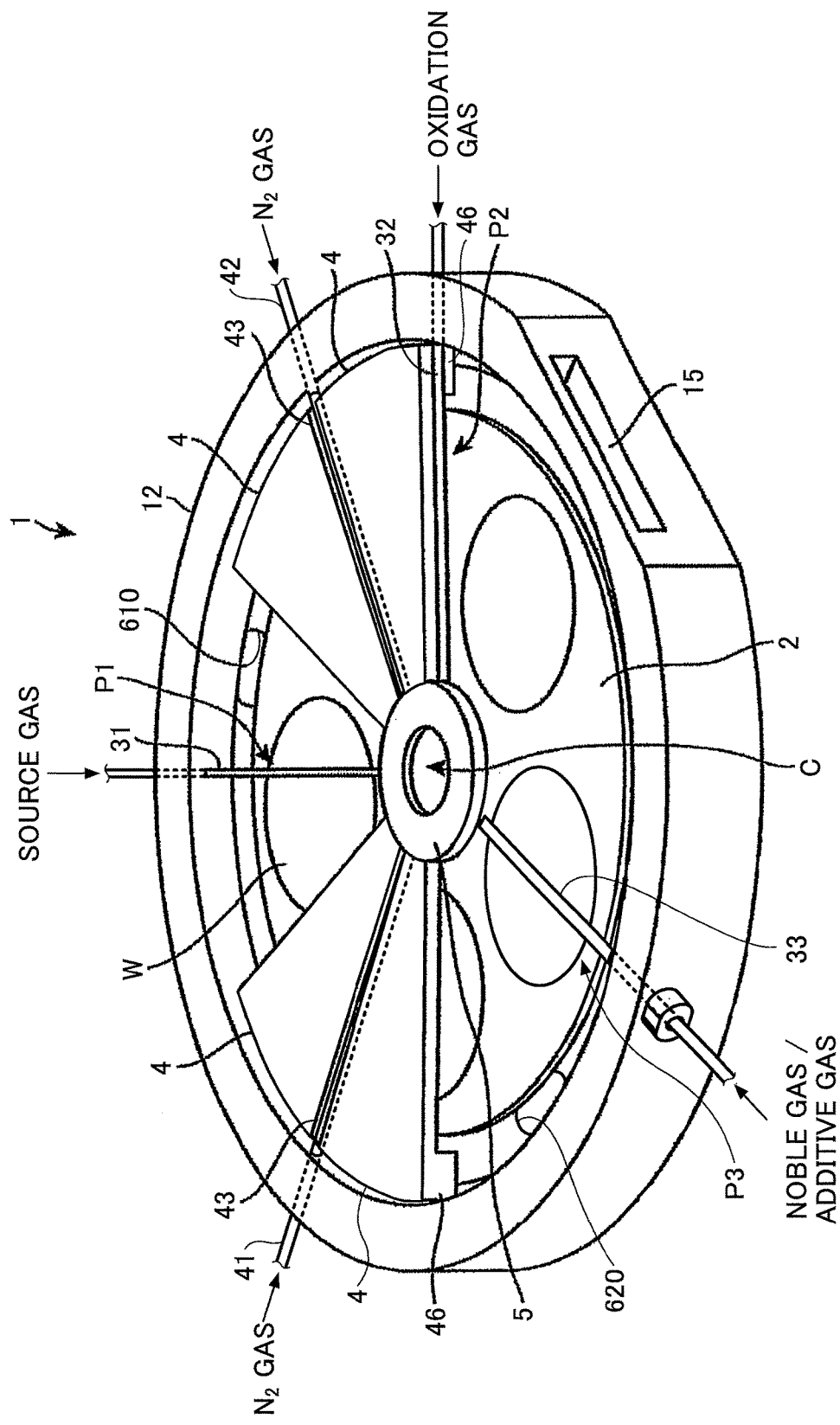
FIG. 2 is a schematic perspective view illustrating an inside structure of a vacuum chamber of the film deposition apparatus illustrated in FIG. 1.
Figure 3:
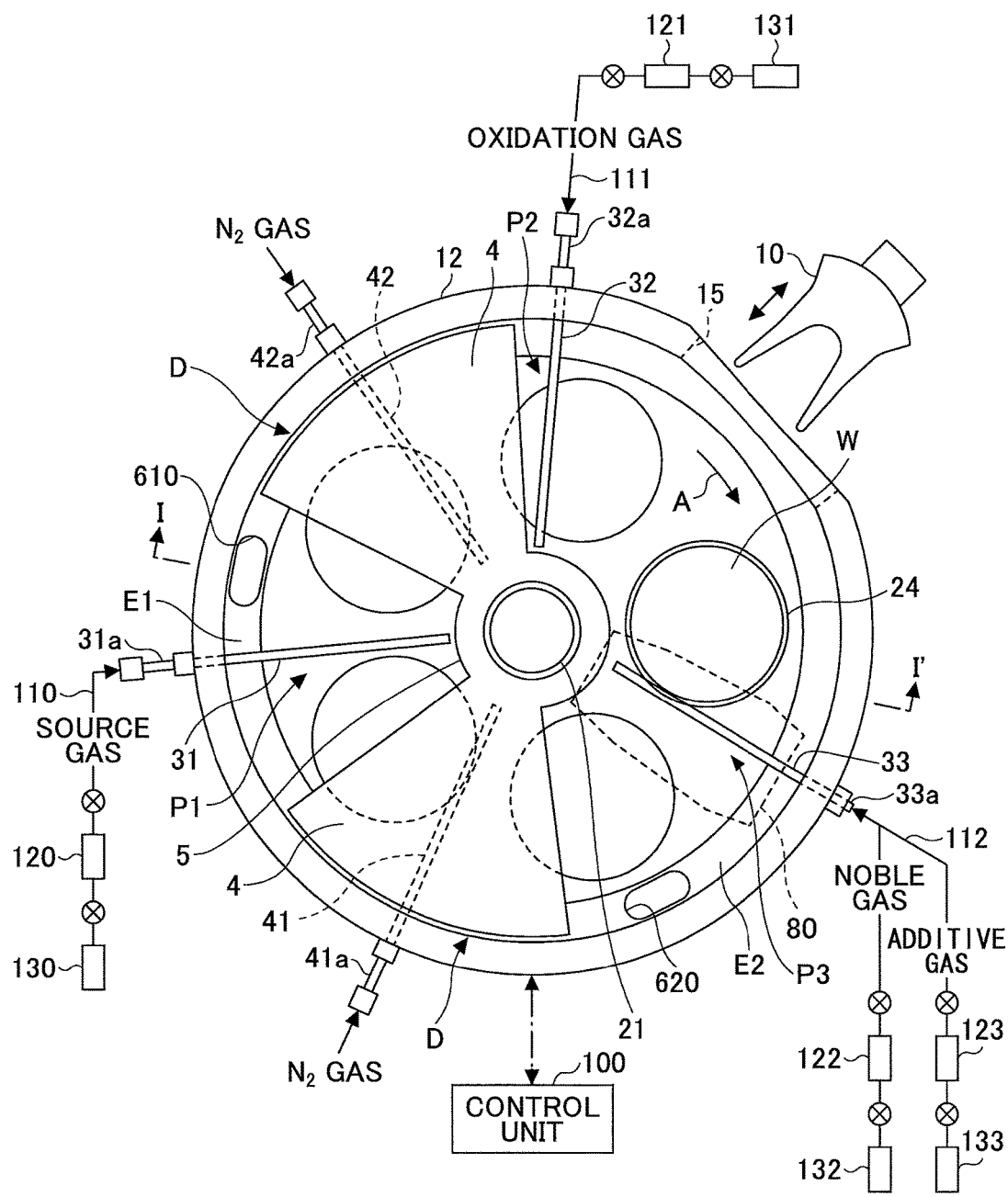
FIG. 3 is a schematic top view illustrating an inside structure of the vacuum chamber of the film deposition apparatus illustrated in FIG. 1.

With reference to FIGS. 1 through 3, the film deposition apparatus includes a vacuum chamber 1 having a substantially flat circular shape, and a turntable 2 having a rotational axis coincident with the center of the vacuum chamber 1. The vacuum chamber 1 is a process chamber to contain a wafer therein and to perform a film deposition process on a surface of the wafer. The vacuum chamber 1 includes a chamber body 12 having a cylindrical shape with a bottom surface, and a ceiling plate 11 placed on the upper surface of the chamber body 12. The ceiling plate 11 is detachably placed on the chamber body 12 via a sealing member 13 (FIG. 1) such as an O-ring in an airtight manner.

The turntable 2 is provided in the vacuum chamber 1. The turntable 2 is attached to a cylindrical shaped core portion 21 at its center portion. The core portion 21 is fixed to the upper end of a rotary shaft 22 that extends in the vertical direction. The rotary shaft 22 is provided to penetrate through the bottom portion 14 of the vacuum chamber 1 and its lower end is attached to a driving unit 23 that rotates the rotary shaft 22 (FIG. 1) about a vertical axis. The rotary shaft 22 and the driving unit 23 are housed in a cylindrical case body 20 whose upper surface is open. The case body 20 is attached to a lower surface of the bottom portion 14 of the vacuum chamber 1 via a flange portion provided at its upper surface in an airtight manner so that an inner atmosphere of the case body 20 is isolated from the outside atmosphere.

Although details are described below, in the method for forming the protective film according to an embodiment of the present invention, the turntable 2 is rotated at a predetermined high speed in a range of 90 to 300 rpm, preferably in a range of 120 to 300 rpm. Hence, the driving unit 23 is configured to be able to rotate the turntable 2 at least in a range of 90 to 300 rpm. In the meantime, in a general film deposition process, the rotational speed of the turntable 2 is often set in a range of about 20 to about 30 rpm.

As illustrated in FIGS. 2 and 3, a plurality of (five in the example of the drawing) circular concave portions 24 is provided in a top surface of the turntable 2 along a rotating direction (circumferential direction) to receive the plurality of semiconductor wafers (which will be simply referred to as "wafers" hereinafter) W, respectively. In FIG. 3, only a single wafer W is illustrated in one of the concave portions 24 for an explanatory purpose. Each of the concave portions 24 is formed to have a slightly larger (for example, 4 mm larger) diameter than that of the wafer W, and a depth substantially equal to the thickness of the wafer W. Thus, when the wafer W is placed in the respective concave portion 24, the surface of the wafer W and the surface of the turntable 2 (where the wafer W is not placed) become almost the same height. Each of the concave portions 24 has three, for example, through holes formed in the bottom, through which lift pins for supporting a back surface of the respective wafer W and lifting the wafer W penetrate.

FIGS. 2 and 3 are diagrams for explaining an internal structure of the vacuum chamber 1. The ceiling plate 11 is not illustrated in FIG. 2 and FIG. 3 for an explanatory purpose. As illustrated in FIGS. 2 and 3, a reaction gas nozzle 31, a reaction gas nozzle 32, a reaction gas nozzle 33, separation gas nozzles 41 and 42, which are made of quartz, for example, are provided above the turntable 2. In the example illustrated in FIG. 3, the reaction gas nozzle 33, the separation gas nozzle 41, the reaction gas nozzle 31, the separation gas nozzle 42, and the reaction gas nozzle 32, are arranged in this order from a transfer port 15 (which will be explained later) in a clockwise direction (the rotation direction of the turntable 2 as illustrated by an arrow A in FIG. 3) with a space therebetween in a circumferential direction of the vacuum chamber 1. Gas introduction ports 31a, 32a, 33a, 41a, and 42a (FIG. 3) that are base portions of the nozzles 31, 32, 33, 41, and 42, respectively, are fixed to an outer peripheral wall of the chamber body 12 so that these nozzles 31, 32, 33, 41, and 42 are introduced into the vacuum chamber 1 from the outer peripheral wall of the vacuum chamber 1 so as to extend in a radial direction and parallel to the surface of the turntable 2.

In this embodiment, as illustrated in FIG. 3, the reaction gas nozzle 31 is connected to a source gas supplying source 130 via a pipe 110, a flow controller 120 and the like. The reaction gas nozzle 32 is connected to an oxidation gas ($H_2O$, $H_2O_2$, $O_2$ or $O_3$) supplying source 131 via a pipe 111, a flow controller 121 and the like. The reaction gas nozzle 33 is connected to a noble gas (Ar and the like) supplying source 132 and an additive gas ($O_2$ or $H_2$ and the like) supplying source 133 via a pipe 112, a flow controller 122 and the like. The separation gas nozzles 41 and 42 are connected to supplying sources (not illustrated in the drawings) of a separation gas via pipes and flow controller valves and the like (not illustrated in the drawings), respectively. A noble gas such as helium (He) or argon (Ar) or inert gas such as nitrogen ($N_2$) gas can be used as the separation gas. The present embodiment is described by citing an example of using $N_2$ gas as the separation gas.

The reaction gas nozzle 32 may be connected to a nitriding gas supplying source. When a nitriding process is performed by supplying a nitriding gas from the reaction gas nozzle 32, the oxidation gas supplying source 131 can be served as a nitriding gas supply source 131 by filling the oxidation gas supplying source 131 in FIG. 3 with a nitriding gas such as an $NH_3$-containing gas, an $N_2$-containing gas and the like. In this case, as illustrated in FIG. 3, the reaction gas nozzle 32 is connected to the nitriding gas ($NH_3$ or $N_2$) supplying source 131 via the pipe 111 and the flow controller 121.

Each of the reaction gas nozzles 31, 32 and 33 has a plurality of gas discharge holes 35 (see FIG. 4) that faces downward to the turntable 2 along the longitudinal directions of each of the reaction gas nozzles 31, 32 and 33 at intervals of 10 mm, for example. An area below the reaction gas nozzle 31 is a first process area P1 in which the first reaction gas is adsorbed on the wafers W. An area below the reaction gas nozzle 32 is a second process area P2 in which the second reaction gas that reacts with the first reaction gas adsorbed on the wafer W is supplied, thereby producing a molecular layer of an oxidation product of an organic metal or an organic semi-metal contained in the source gas as a reaction product by thermal oxidation. The molecular layer of the organic metal oxidation product or the organic semi-metal oxidation product constitutes a protective film to be deposited. An area below the reaction gas nozzle 33 is a third process area P3 in which a noble gas and an additive gas are supplied, while being converted to plasma, to the organic metal oxidation product or the organic semi-metal oxidation product (protective film) produced in the second process area P2 by the thermal oxidation, thereby performing a plasma treatment process. Here, because the first process area P1 is an area where the source gas is suppled, the first process area P1 may be referred to as a source gas supply area P1. Similarly, because the second process area is an area where the oxidation gas for performing the thermal oxidation is supplied, the second process area P2 may be referred to as an oxidation gas supply area P2. Also, the third process area P3 is an area where the plasma gas (the noble gas and the additive gas) for performing the plasma process is supplied, the third process area P3 may be referred to as a plasma gas supply area P3.

Here, even when a nitriding gas is supplied from the reaction gas nozzle 32, the area below the reaction gas nozzle 32 is the second process area P2. In this case, the nitriding gas for nitriding the source gas adsorbed on the wafer W in the first process area P1 is supplied in the second process area P2, and a molecular layer of a nitriding product of the organic metal or the organic semi-metal contained in the source gas is produced as a reaction product by thermal nitridation. The molecular layer of the organic metal nitriding product or the organic semi-metal nitriding product constitutes the protective film to be deposited. The area below the reaction gas nozzle 33 serves as the third process area P3 where the noble gas and the additive gas are supplied, while being converted to plasma, to the organic metal nitriding product or the organic semi-metal nitriding product (protective film) produced in the second process area P2 by the thermal nitridation, thereby performing the plasma treatment process, similarly to the oxidation process. In this case, because the second process area P2 is the area where the nitriding gas for performing the thermal nitridation is supplied, the second process area P2 may be referred to as a nitriding gas supply area P2. Moreover, by combining both names, the second process area P2 may be referred to as an oxidizing and nitriding gas supply area P2.

In the meantime, the third process area P3 does not have to be necessarily provided. In other words, the modification process by plasma is optional, and the film deposition apparatus may be configured to perform only the thermal oxidation process or thermal nitridation process in the second process area P2. In this case, the plasma generator 80 and the reaction gas nozzle 33 do not have to be provided.

In contrast, when the third process area P3 is provided, the plasma generator 80 is provided over the third process area P3, and the reaction gas nozzle 33 is also provided.

Moreover, as further another structure, only the third process area P3 may be provided without providing the second process area P2. In this case, the thermal oxidation process is not performed, but only the plasma oxidation process using the plasma generator 80 is performed by supplying an oxidation gas such as $O_2$ gas as an additive gas in the third process area P3. In this case, the oxidation process and the modification process are performed at the same time. Hence, the reaction gas nozzle 32 does not have to be provided, and the reaction gas nozzle 33 and the plasma generator 80 are provided. In both cases, the reaction gas nozzle 31 is definitely provided, and at least one of the reaction gas nozzles 32 and 33 is provided. In addition, the separation gas nozzles 41 and 42 are preferably provided in either case.

Similarly, even in the nitriding process, the film deposition apparatus may be configured to only include the third process area P3 without including the second process area P2. In this case, the thermal nitridation process is not performed, but only the plasma nitriding process using the plasma generator 80 is performed by supplying a nitriding gas such as $NH_3$ gas as an additive gas in the third process area P3. In this case, the nitriding process and the modification process are performed at the same time.

Thus, the method for forming the protective film according to the embodiment of the present invention can include a variety of oxidation processes and nitriding processes. In response to this, the film deposition apparatus can take a variety of structures.

In FIG. 3, the plasma generator is simply illustrated by a dotted line for an explanatory purpose. A detail of the plasma generator 80 is described later.

The source gas supplied from the reaction gas nozzle 33 is an organic metal gas or an organic semi-metal gas. A variety of organic metal gases or organic semi-metal gases can be used as the source gas, and the source gas is selected depending on a kind of the protective film. For example, the organic metal gas may be selected from organic metal gases used for film deposition of a High-k film. The organic metal gas may be a gas containing a variety of organic metals, and for example, when a protective film of $TiO_2$ is formed, a gas containing an organic amino titanium such as TDMAT (Tetrakis(dimethylamino)titanium) is selected. Moreover, an organic silane gas, for example, an organic aminosilane gas such as 3DMASi may be used as the organic semi-metal gas.

A variety of oxidation gases can be used as the oxidation gas supplied from the second reaction gas nozzle 32 as long as the oxidation gas can produce an organic metal oxidation product by reacting with the supplied organic metal gas. For example, $H_2O$, $H_2O_2$, $O_2$, $O_3$ and the like are selected when the organic metal gas is oxidized by thermal oxidation.

Similarly, a variety of nitriding gases can be used as the nitriding gas supplied from the second reaction gas nozzle 32 as long as the nitriding gas can produce an organic metal nitriding product by reacting with the supplied organic metal gas. For example, an $NH_3$-containing gas is selected when nitriding of the organic metal gas is performed by thermal nitridiation, and, an $NH_3$-containing gas or an $N_2$-containing gas is selected when nitriding of the organic metal gas is performed by plasma nitridiation.

Ar gas, He gas or the like is selected as the noble gas supplied from the reaction gas nozzle 33, and $O_2$ gas, $H_2$ gas or the like is selected as the additive gas supplied from the reaction gas nozzle 33 together.

Referring to FIGS. 2 and 3, the ceiling plate 11 includes two convex portions 4 protruding in the vacuum chamber 1. As will be explained later, the protruding portions are attached to a lower surface of the ceiling plate 11 so as to protrude toward the turntable 2 to form separation areas D with the corresponding separation gas nozzles 41 and 42. Each of the convex portions 4 has substantially a fan-like top view shape where the apex is removed in an arc shape. For each of the convex portions 4, the inner arc shaped portion is connected to a protruding portion 5 (which will be explained later) and the outer arc shaped portion is formed to extend along an inner peripheral surface of the chamber body 12 of the vacuum chamber 1.

Figure 4:
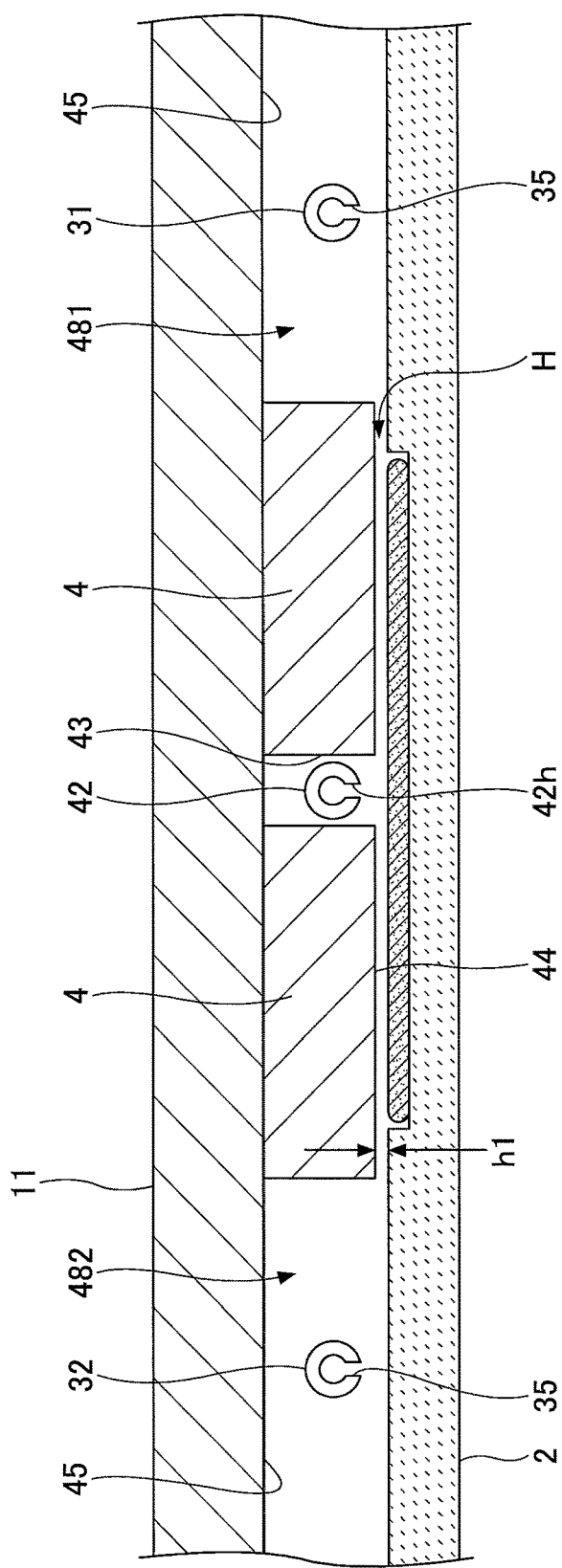
FIG. 4 is a schematic partial cross-sectional view of the vacuum chamber of the film deposition apparatus illustrated in FIG. 1.

FIG. 4 illustrates a cross-section of the vacuum chamber 1 along a concentric circle of the turntable 2 from the reaction gas nozzle 31 to the reaction gas nozzle 32. As illustrated in FIG. 4, the convex portion 4 is fixed to the lower surface of the ceiling plate 11. Thus, there are provided a flat low ceiling surface 44 (first ceiling surface) formed as the lower surface of the convex portion 4 and flat higher ceiling surfaces 45 (second ceiling surfaces) which are higher than the low ceiling surface 44 and formed on both sides of the low ceiling surface 44 in the circumferential direction. The low ceiling surface 44 has substantially a fan-like top view shape where the apex is removed in an arc shape. Furthermore, as illustrated in the drawings, the convex portion 4 includes a groove portion 43 at a center in the circumferential direction. The groove portion 43 is formed to extend in the radial direction of the turntable 2. The separation gas nozzle 42 is housed in the groove portion 43. Although not illustrated in FIG. 4, the separation gas nozzle 41 is also housed in a groove portion provided in the other convex portion 4. The reaction gas nozzles 31 and 32 are provided in spaces below the high ceiling surfaces 45, respectively. The reaction gas nozzles 31 and 32 are provided in the vicinity of the wafers W apart from the high ceiling surfaces 45, respectively. Here, the reaction gas nozzle 31 is provided in a space 481 below and on the right side of the high ceiling surface 45, and the reaction gas nozzle 32 is provided in a space 482 below and on the left side of the high ceiling surface 45.

Each of the separation gas nozzles 41 and 42 has a plurality of gas discharge holes 42h (see FIG. 4) formed along the longitudinal direction thereof at a predetermined interval (10 mm, for example).

The low ceiling surface 44 provides a separation space H, which is a narrow space, with respect to the turntable 2. When $N_2$ gas is supplied from the separation gas nozzle 42 to the separation space H, this $N_2$ gas flows toward the space 481 and the space 482 through the separation space H. On this occasion, because the volume of the separation space H is smaller than those of the spaces 481 and 482, the pressure in the separation space H can be made higher than those in the spaces 481 and 482 by $N_2$ gas. It means that the separation space H having the higher pressure is formed between the spaces 481 and 482. Moreover, $N_2$ gas flowing from the separation space H toward the spaces 481 and 482 functions as a counter flow against the source gas from the gas first process area P1 and the oxidation or nitriding gas from the second process area P2. Thus, the source gas from the first process area P1 is separated from the oxidation or nitriding gas from the second process area P2 by the separation space H. Therefore, mixing and reacting of the source gas with the oxidation or nitriding gas are prevented in the vacuum chamber 1.

The height h1 of the low ceiling surface 44 above an upper surface of the turntable 2 is preferred to be appropriately determined based on the pressure of the vacuum chamber 1 during the film deposition, the rotational speed of the turntable 2, and a supplying amount of the separation gas ($N_2$ gas) in order to maintain the pressure in the separation space H higher than those in the spaces 481 and 482.

Referring to FIGS. 1 through 3, the ceiling plate 11 further includes the protruding portion 5 at its lower surface to surround the outer periphery of the core portion 21 which fixes the turntable 2. The protruding portion 5 is continuously formed with the inner portions of the convex portions 4 and has a lower surface which is formed at the same height as those of the low ceiling surfaces 44, in this embodiment.

Figure 5:
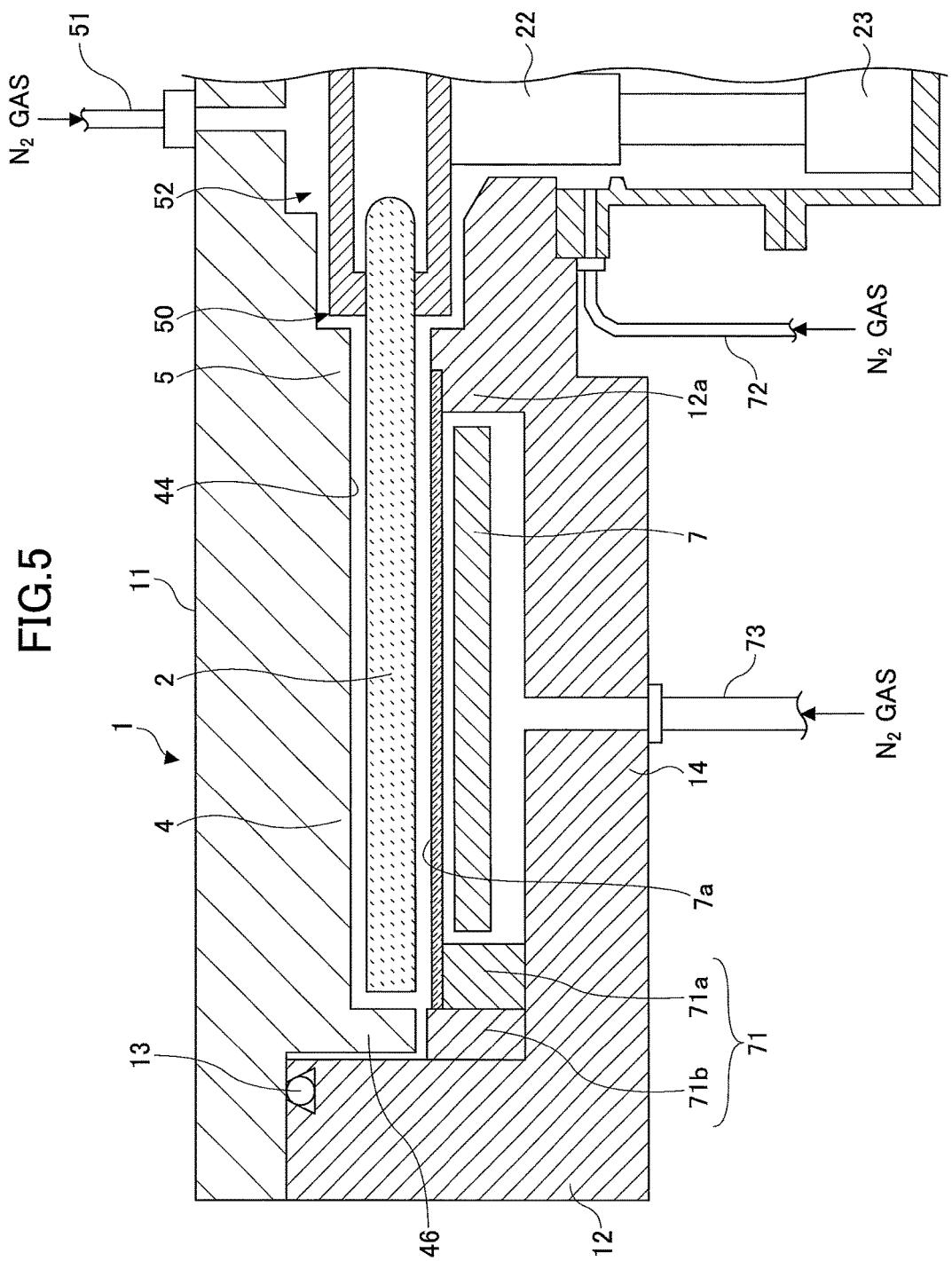
FIG. 5 is another schematic cross-sectional view of the film deposition apparatus illustrated in FIG. 1.

FIG. 1 is a cross-sectional view taken along an I-I' line in FIG. 3, and illustrating an area where the ceiling surface 45 is provided. FIG. 5 is a partial cross-sectional view illustrating an area where the ceiling surface 44 is provided. As illustrated in FIG. 5, the convex portion 4 having a substantially fan-like top view shape includes an outer bending portion 46 at its outer peripheral end portion (at an outer peripheral end portion side of the vacuum chamber 1) which is bent to have an L-shape to face an outer end surface of the turntable 2. The outer bending portion 46 suppresses a flow of gas between the space 481 and the space 482 through the space between the turntable 2 and the inner peripheral surface of the chamber body 12. As described above, the convex portions 4 are provided on the ceiling plate 11 which is detachably attached to the chamber body 12. Thus, there is a slight space between the outer periphery surface of the outer bending portion 46 and the chamber body 12. The spaces between the inner periphery surface of the outer bending portion 46 and an outer surface of the turntable 2, and the space between the outer periphery surface of the outer bending portion 46 and the chamber body 12 are set at the same size as the height h1 (see FIG. 4) of the low ceiling surface 44 with respect to the upper surface of the turntable 2, for example.

As illustrated in FIG. 5, the inner peripheral wall of the chamber body 12 is provided to extend in a vertical direction to be closer to the outer peripheral surface of the outer bending portion 46 at the separation area H. However, other than the separation area H, as illustrated in FIG. 1, for example, the inner peripheral wall of the chamber body 12 is formed to have a concave portion recessed outward from a location facing the outer end surface of the turntable 2 to the upper end of the bottom portion 14. Hereinafter, for an explanatory purpose, the concave portion, having a substantially rectangular cross-sectional view, is referred to as an "evacuation area". Specifically, a part of the evacuation area which is in communication with the first process area P1 is referred to as a first evacuation area E1, and a part of the evacuation area which is in communication with the second and third process areas P2 and P3 is referred to as a second evacuation area E2. As illustrated in FIGS. 1 through 3, a first evacuation port 610 and a second evacuation port 620 are respectively provided at the bottom portions of the first evacuation area E1 and the second evacuation area E2. The first evacuation port 610 and the second evacuation port 620 are connected to vacuum pumps 640, which are vacuum evacuation units, via evacuation pipes 630, respectively, as illustrated in FIG. 1. Moreover, a pressure regulator 650 is provided between the vacuum pumps 640 and the evacuation pipes in FIG. 1.

As illustrated in FIGS. 1 and 5, a heater unit 7, which is a heating device, is provided in a space between the bottom portion 14 of the vacuum chamber 1 and the turntable 2, and heats a wafer W on the turntable 2 via the turntable 2 up to a temperature determined by a process recipe (e.g., 150 degrees C.). As illustrated in FIG. 5, a ring-shaped cover member 71 is provided below, at and near the periphery of the turntable 2 to prevent a gas from entering an area under the turntable 2 by separating an atmosphere from a space above the turntable 2 to the evacuation areas E1 and E2 from an atmosphere in which the heater unit 7 is placed. The cover member 71 includes an inner member 71a provided under the periphery and outside of the turntable 2 and an outer member 71b provided between the inner member 71a and the inner side wall of the vacuum chamber 1. The outer member 71b is provided to face the outer bending portion 46, which is formed at an outer edge portion at lower side of each of the convex portions 4. The inner member 71a is provided to surround the entirety of the heater unit 7 below the outer end portion (and at a slightly outer side of the outer edge portion) of the turntable 2.

The bottom portion 14 of the vacuum chamber 1 closer to the rotation center than the space where the heater unit 7 is provided protrudes upward to be close to the core portion 21 to form a projecting portion 12a. There is provided a narrow space between the projecting portion 12a and the core portion 21. Furthermore, there is provided a narrow space between an inner peripheral surface of the bottom portion 14 and the rotary shaft 22 to be in communication with the case body 20. A purge gas supplying pipe 72 which supplies $N_2$ gas as the purge gas to the narrow space for purging is provided in the case body 20. The bottom portion 14 of the vacuum chamber 1 includes a plurality of purge gas supplying pipes 73 (only one of the purge gas supplying pipes 73 is illustrated in FIG. 5) which are provided at a predetermined angle interval in the circumferential direction below the heater unit 7 for purging the space where the heater unit 7 is provided. Moreover, a cover member 7a is provided between the heater unit 7 and the turntable 2 to prevent the gas from going into the space where the heater unit 7 is provided. The cover member 7a is provided to extend from an inner peripheral wall (upper surface of the inner member 71a) of the outer member 71b to an upper end portion of the projecting portion 12a in the circumferential direction. The cover member 7a may be made of quartz, for example.

The film deposition apparatus 1 further includes a separation gas supplying pipe 51 that is connected to a center portion of the ceiling plate 11 of the vacuum chamber 1 and provided to supply $N_2$ gas as the separation gas to a space 52 between the ceiling plate 11 and the core portion 21. The separation gas supplied to the space 52 flows through a narrow space between the protruding portion 5 and the turntable 2 so as to flow along the top surface of the turntable 2 where the wafers W are to be placed and is discharged toward the outer periphery. The space 50 is kept at a pressure higher than those of the space 481 and the space 482 by the separation gas. Thus, the mixing of the first reaction gas such as $TiCl_4$ supplied to the first process area P1 and the second reaction gas such as $H_2O$ supplied to the second process area P2 by flowing through the center area C can be prevented by the space 50. It means that the space 50 (or the center area C) can function similarly to the separation space H (or the separation area D).

In addition, as illustrated in FIGS. 2 and 3, a transfer port 15 is formed in a side wall of the vacuum chamber 1 for allowing the wafers W, which are substrates, to pass between an external transfer arm 9 and the turntable 2. The transfer port 15 is opened and closed by a gate valve (not illustrated in the drawings). Furthermore, lift pins, which penetrate through the concave portion 24 to lift up the wafer W from a backside surface, and a lifting mechanism for the lift pins (both of which are not illustrated in the drawings) are provided at a location where the wafer W is transferred and below the turntable 2 because the wafer W is transferred between the external transfer arm 9 and the concave portion 24 of the turntable 2, which is a substrate receiving area, at a location facing the transfer port 15.

Figure 6:
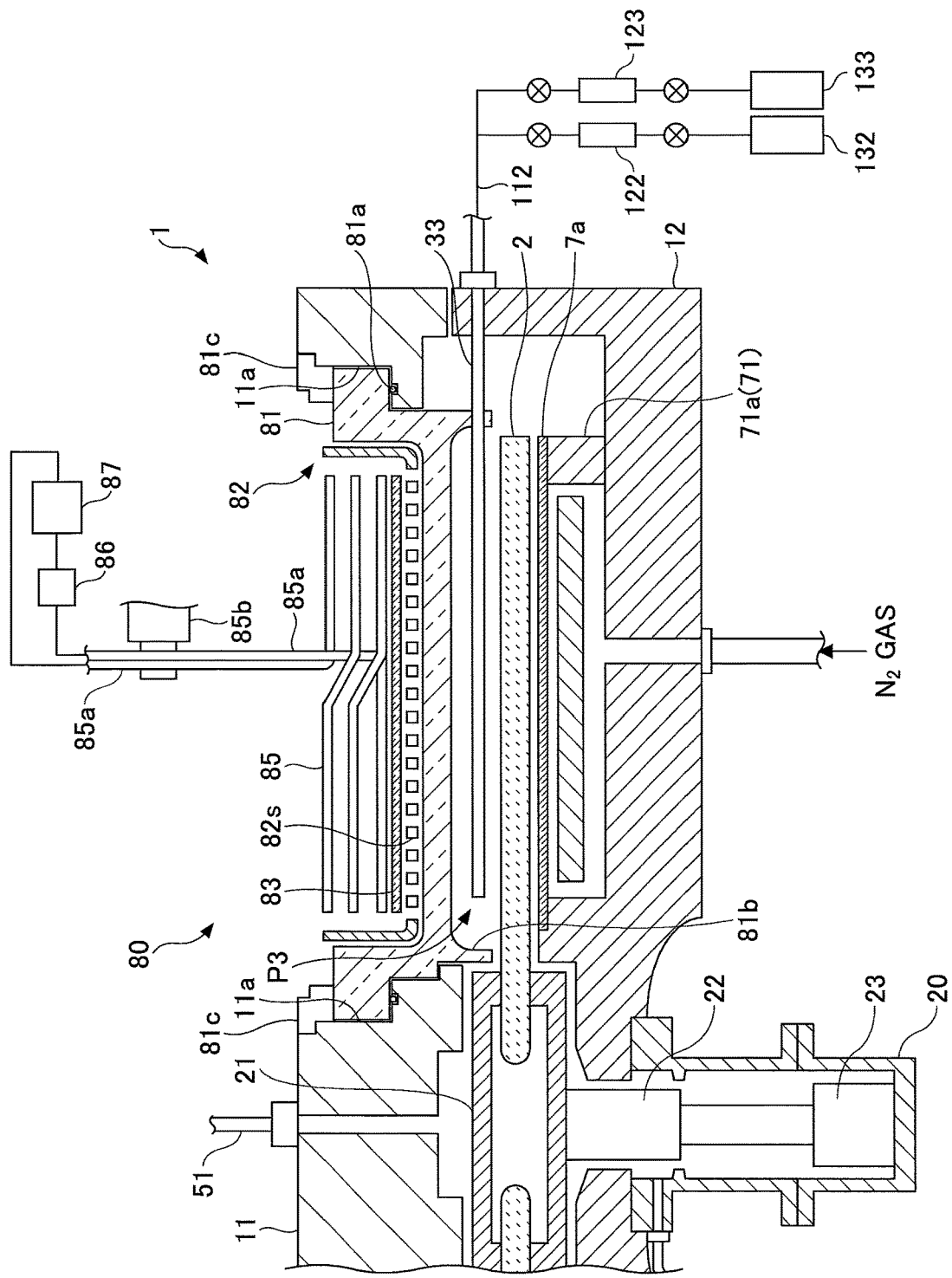
FIG. 6 is a schematic cross-sectional view illustrating a plasma generator provided in the film deposition apparatus illustrated in FIG. 1.
Figure 7:
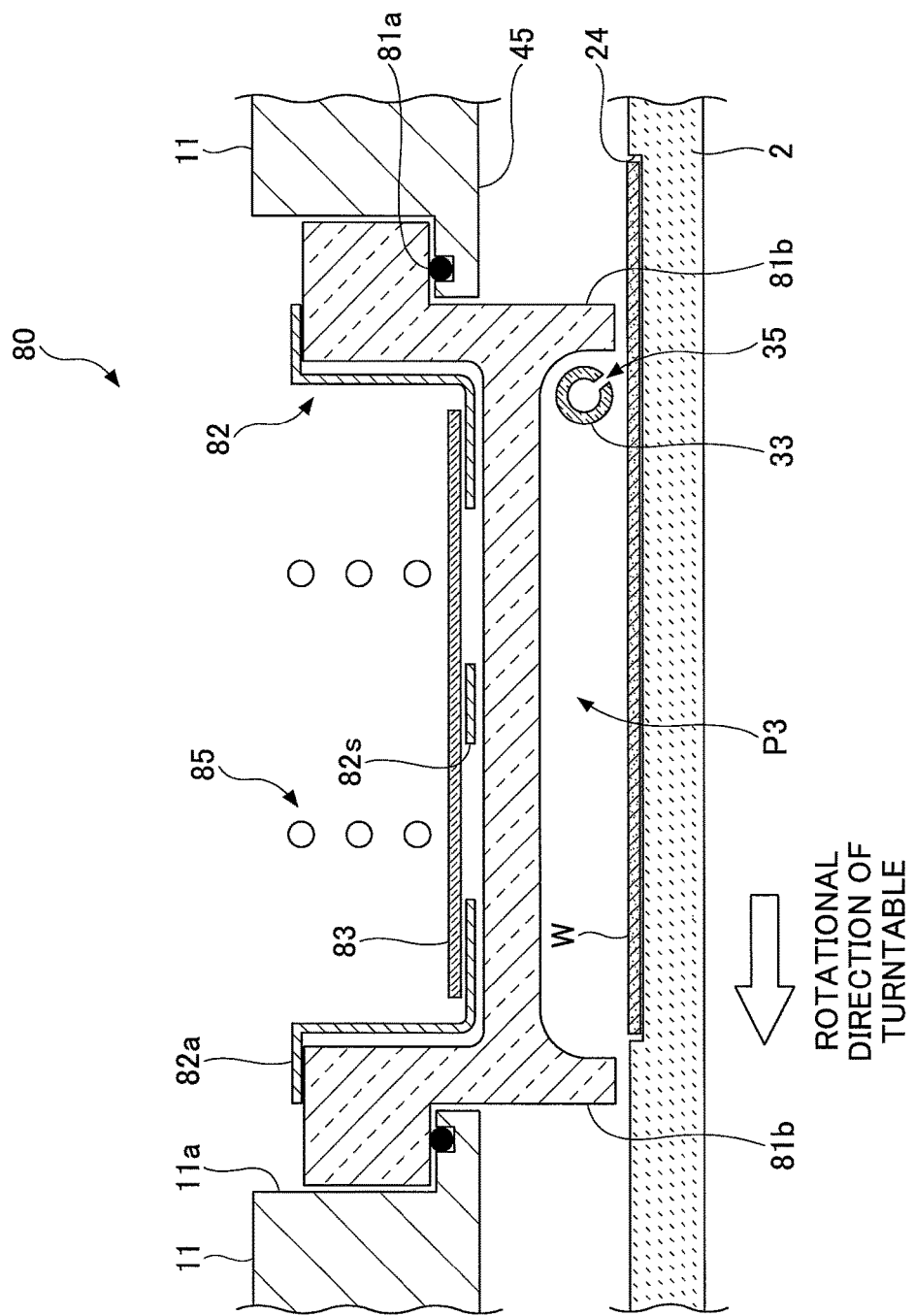
FIG. 7 is another schematic cross-sectional view illustrating the plasma generator provided in the film deposition apparatus illustrated in FIG. 1.
Figure 8:
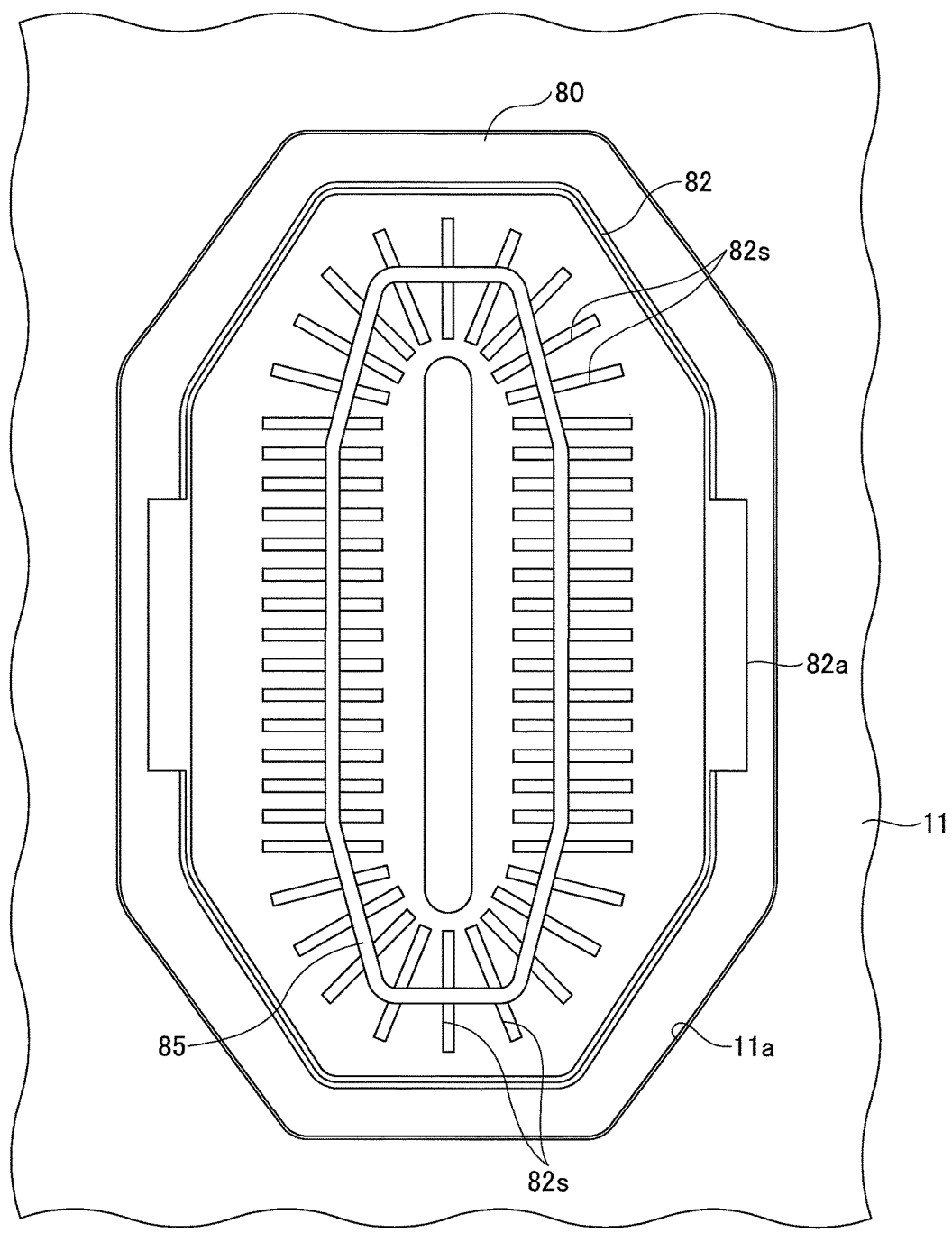
FIG. 8 is a schematic top view of the plasma generator provided in the film deposition apparatus illustrated in FIG. 1.

Next, the plasma generator 80 is explained with reference to FIGS. 6 through 8. FIG. 6 is a schematic cross-sectional view of the plasma generator 80 taken along the radial direction of the turntable 2. FIG. 7 is a schematic cross-sectional view of the plasma generator 80 taken along a direction perpendicular to the radial direction of the turntable 2. FIG. 8 is a schematic top view illustrating the plasma generator 80. For an explanatory purpose, parts of the components are simplified or are not illustrated in the drawings.

Referring to FIG. 6, the plasma generator 80 is made of a material that transmits radio frequency waves, and has a concave portion in its upper surface. The plasma generator 80 further includes a frame member 81 that is embedded in an opening 11a provided in the ceiling plate 11, a Faraday shield plate 82 housed in the concave portion of the frame member 81 and having substantially a box shape whose top is opened, an insulating plate 83 placed on a bottom surface of the Faraday shield plate 82, and a coil antenna 85 supported by the insulating plate 83 thereon. The antenna 85 has substantially an octagonal upper plane shape.

The opening 11a of the ceiling plate 11 is formed to have a plurality of step portions, and one of the step portions has a groove portion to extend along the perimeter where a sealing member 81a such as an O-ring or the like is embedded. The frame member 81 is formed to have a plurality of step portions that correspond to the step portions of the opening 11a, and when the frame member 81 is engaged in the opening 11a, a back side surface of one of the step portions contacts the sealing member 81a embedded in the opening 11a so that the ceiling plate 11 and the frame member 81 are kept in an air-tight manner. Moreover, as illustrated in FIG. 6, a pushing member 81c, which extends along the outer peripheral of the frame member 81 that is fitted in the opening 11a of the ceiling plate 11, is provided so that the frame member 81 is pushed downward with respect to the ceiling plate 11. Thus, the ceiling plate 11 and the frame member 81 are further kept in an air-tight manner.

The lower surface of the frame member 81 is positioned to face the turntable 2 in the vacuum chamber 1 and a projection portion 81b that projects downward (toward the turntable 2) is provided at the perimeter at the lower surface.

The lower surface of the projection portion 81b is close to the surface of the turntable 2 and a space (hereinafter referred to as the third process area P3) is surrounded by the projection portion 81b, the surface of the turntable 2 and the lower surface of the frame member 81 above the turntable 2. The space between the lower surface of the projection portion 81b and the surface of the turntable 2 may be the same as the height h1 between the ceiling surface 44 and the upper surface of the turntable 2 in the separation space H (FIG. 4).

In addition, the reaction gas nozzle 33 that penetrates through the projection portion 81b is provided in the third process area P3. In this embodiment, as illustrated in FIG. 6, the noble gas supplying source 132 filled with a noble gas such as Ar or He is connected to the reaction gas nozzle 33 by the pipe 112 through the flow controller 122. Also, the additive gas supplying source 133 filled with an additive gas such as $O_2$ gas or $H_2$ gas is connected to the reaction gas nozzle 33 by the pipe 112 through the flow controller 123. In other words, the noble gas whose flow rate is controlled by the flow controller 122 and the additive gas whose flow rate is controlled by the flow controller 123 are mixed at predetermined flow rates, respectively, and the mixed gas is converted to plasma by the plasma generator 80 and is supplied to the third process area P3.

The reaction gas nozzle 33 has a plurality of gas discharge holes 35 formed along the longitudinal direction thereof at a predetermined interval (10 mm, for example), and the above-mentioned halogen-containing gas and the like are discharged from the gas discharge holes 35. As illustrated in FIG. 7, the gas discharge holes 35 are provided to be inclined from a vertical direction with respect to the turntable 2 toward the upstream rotation direction of the turntable 2. Due to this, the gas supplied from the reaction gas nozzle 33 is discharged in a direction opposite to the rotational direction of the turntable 2, specifically, toward a space between a lower surface of the projection portion 81b and the surface of the turntable 2. Thus, the flows of the reaction gas and the separation gas from a space below the ceiling surface 45 that is upstream of the plasma generator 80 toward the third process area P3 along the rotation direction of the turntable 2 can be prevented. Furthermore, as described above, because the projection portion 81b that is formed along an outer periphery of the lower surface of the frame member 81 is close to the surface of the turntable 2, the pressure in the third process area can be kept high by the gas from the reaction gas nozzle 33. This also prevents the reaction gas and the separation gas from flowing into the third process area P3.

Thus, the frame member 81 plays a role in separating the third process area P3 from the second process area P2. Hence, although the film deposition apparatus according to the embodiments does not have to include the whole of the plasma generator 80, the film deposition apparatus according to the embodiments includes the frame member 81 to separate the third process area P3 from the second process area P2 and to prevent the second reaction gas being mixed into the third process gas.

The Faraday shield plate 82 is made of a conductive material such as a metal and is grounded, although not illustrated in the drawings. As clearly illustrated in FIG. 8, the Faraday shield plate 82 has a plurality of slits 82s at its bottom portion. Each of the slits 82s is extending to be substantially perpendicular to a corresponding side of the antenna 85 that has the substantially octagonal plane shape.

As illustrated in FIGS. 7 and 8, the Faraday shield plate 82 includes two support portions 82a that are provided at upper end portions to bend outward. The support portions 82a are supported by the upper surface of the frame member 81 so that the Faraday shield plate 82 is supported at a predetermined position in the frame member 81.

The insulating plate 83 is made of fused quartz, for example, has a size slightly smaller than that of the bottom surface of the Faraday shield plate 82, and is mounted on the bottom surface of the Faraday shield plate 82. The insulating plate 83 insulates the Faraday shield plate 82 from the antenna 85 while passing the radio frequency waves radiated from the antenna 85 downward.

The antenna 85 is formed by winding a pipe made of copper three times, for example, in a substantially octagonal plane shape. Thus, cooling water can be circulated in the pipe, and the antenna 85 is prevented from being heated to be a high temperature by the radio frequency waves supplied to the antenna 85. As illustrated in FIG. 6, the antenna 85 includes a standing portion 85a to which a support portion 85b is attached. The antenna 85 is maintained at a predetermined position in the Faraday shield plate 82 by the support portion 85b. The radio frequency power source 87 is connected to the support portion 85b via the matching box 86. The radio frequency power source 87 is capable of generating radio frequency waves of 13.56 MHz, for example.

According to the plasma generator 80 thus structured, when the radio frequency waves are supplied to the antenna 85 from the radio frequency power source 87 via the matching box 86, an electromagnetic field is generated by the antenna 85. In the electromagnetic field, the electric field component is shielded by the Faraday shield plate 82 so as not to be transmitted downward. On the other hand, the magnetic field component is transmitted into the third process area P3 through the plurality of slits 82s of the Faraday shield plate 82. The noble gas and the additive gas supplied to the third process area P3 from the reaction gas nozzle 33 at a predetermined flow ratio is activated by the magnetic field component.

As illustrated in FIG. 1, the film deposition apparatus according to the present embodiment further includes a control unit 100 that controls the entirety of the film deposition apparatus and a storing unit 101. The control unit 100 may be a computer. The storing unit 101 stores a program by which the film deposition apparatus executes the film deposition method (as will be explained later) under a control of the control unit 100. The program is formed to include steps capable of executing the film deposition method. The storing unit 101 may be a hard disk or the like, for example. The program stored in the storing unit 101 may be previously stored in a recording medium 102 such as a compact disk (CD), a magneto-optic disk, a memory card, a flexible disk, or the like and may be installed in the storing unit 101 using a predetermined reading device.

The control unit 100 may also control the rotational speed of the turntable 2. Thus, the rotational speed of the turntable 2 can be set at 90 to 300 rpm, or 120 to 300 rpm, as discussed above.

[Method for Forming a Film Protective Film]

Next, a method for forming a protective film according to an embodiment of the present invention is described below by citing an example of using the above-mentioned film deposition apparatus, with reference to FIGS. 9A through 9F. FIGS. 9A through 9F are diagrams for illustrating an example of the method for forming the protective film according to the embodiment of the present invention.

Figure 9A:
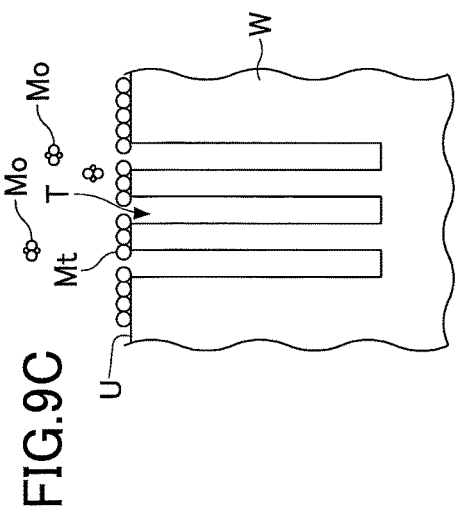
FIG. 9A is a diagram illustrating an example of a surface pattern of a wafer used in the method for forming the protective film according to an embodiment of the present invention.

FIG. 9A is a diagram illustrating an example of a surface pattern of a wafer W used in the method for forming the protective film according to the embodiment. In the present embodiment, a silicon wafer is used as the wafer W and the silicon wafer has a plurality of trenches T as illustrated in FIG. 9A. An example of supplying an organic aminosilane gas from the reaction gas nozzle 31, $H_2O_2$ from the second reaction gas nozzle 32 as the oxidation gas, and a mixed gas of Ar gas and $O_2$ gas (which is hereinafter expressed as $Ar/O_2$ gas) from the reaction gas nozzle 33, respectively, is described below.

Hereinafter, although the oxidation process is mainly described, because it is possible to form a protective film made of a nitriding film by supplying a nitriding gas from the reaction gas nozzle 32, the nitriding process is also described together. When the nitriding process is performed, the reaction gas nozzle 32 supplies $NH_3$ gas as the nitriding gas, and the reaction gas nozzle 33 supplies a mixed gas of Ar gas and $N_2$ gas (which is hereinafter expressed as $Ar/N_2$ gas).

A variety of gases can be used as an organic amino titanium gas used as a Ti precursor. For example, TDMAT (Tetrakis(dimethylamino)titanium) can be cited as a typical example. However, in the following description, the type of gas is not limited to a specific gas, and an example of using any organic amino titanium gas is described below.

First, a gate valve (not illustrated in the drawings) is opened and the wafer W is transferred to the concave portion 24 of the turntable 2 via the transfer port 15 (FIG. 2 and FIG. 3) by the transfer arm 10 (FIG. 3) from the outside. This transfer is performed by lifting the lift pins (not illustrated in the drawings) via through holes provided in the bottom surface of the concave portion 24 from the bottom portion side of the vacuum chamber 1 when the concave portion 24 stops at a position facing the transfer port 15. By repeating such a wafer transfer while intermittently rotating the turntable 2, the wafers W are loaded into the concave portions 24, respectively.

Then, the gate valve is closed, and the vacuum chamber 1 is evacuated by the vacuum pump 640 to the attainable degree of vacuum. Then, $N_2$ gas as a separation gas is discharged from the separation gas nozzles 41 and 42 at a predetermined flow rate. At this time, $N_2$ gas is also discharged from the separation gas supplying pipe 51 and the purge gas supplying pipes 72 and 73 at a predetermined flow rate, respectively. With this, the vacuum chamber 1 is adjusted to a preset processing pressure by the pressure regulator 650 (FIG. 1). Then, the wafers W are heated to 150 degrees C., for example, by the heater unit 7 while rotating the turntable 2 in a clockwise direction at a high rotational speed of 120 rpm, for example.

Subsequently, an organic amino titanium gas is supplied from the reaction gas nozzle 31 (FIG. 2 and FIG. 3), and $H_2O_2$ gas is supplied from the reaction gas nozzle 32. Furthermore, $Ar/O_2$ gas is supplied from the reaction gas nozzle 33, and radio frequency power of 13.56 MHz is supplied to the antenna 85 of the plasma generator 80 at 1400 W, for example. Thus, oxygen plasma is generated in the third process area P3 between the plasma generator 80 (FIG. 6) and the turntable 2. In the oxygen plasma, active species such as oxygen ions and oxygen radicals, and high-energy particles are generated.

Similarly, in the nitriding process, the reaction gas nozzle 32 supplies $NH_3$ gas, and the reaction gas nozzle 33 supplies $Ar/N_2$ gas. The other conditions are the same as the oxidation process. Nitrogen plasma is generated in the third process area P3 between the plasma generator 80 and the turntable 2. In the nitrogen plasma, active species such as nitrogen ions and nitrogen radicals, and high-energy particles are generated.

Figure 9B:
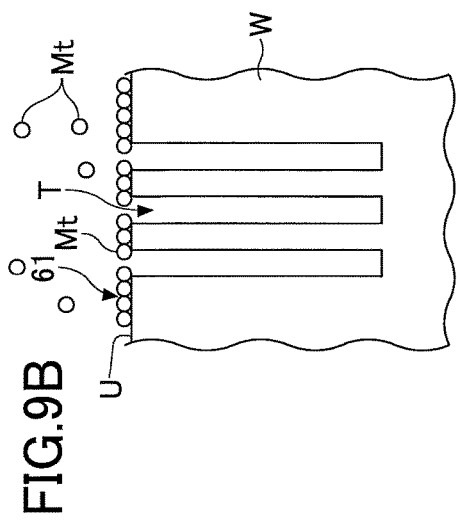
FIG. 9B is a diagram illustrating an example of a source gas adsorption process.

FIG. 9B is a diagram illustrating an example of a source gas adsorption process. By the rotation of the turntable 2, the wafer W repeatedly passes through the first process area P1, the separation area D, the second process area P2, the third process area P3, and the separation area D in this order (see FIG. 3). As illustrated in FIG. 9B, molecules Mt of the organic amino titanium gas adsorb on a surface U of the wafer W, and a molecular layer 61 of the organic amino titanium is formed. Here, the molecules Mt of the organic amino titanium gas, which is one of the organic metal gases, have large diameters because organic groups are attached to titanium, which is one of metals, so as to surround titanium. Furthermore, the molecules Mt of the organic amino titanium do not reach a lower portion of the trenches T, and adsorb on the surface U of the wafer W.

Figure 9C:
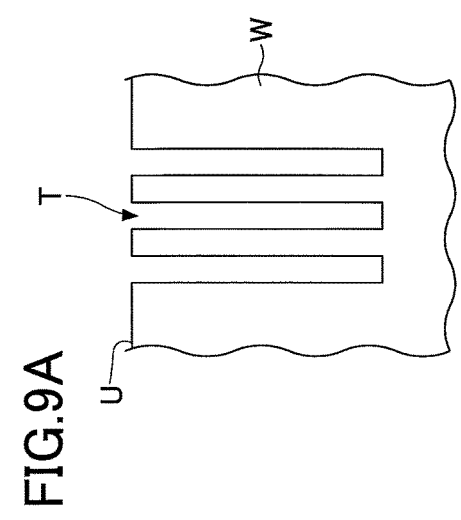
FIG. 9C is a first diagram illustrating an example of an oxidation process.
Figure 9D:
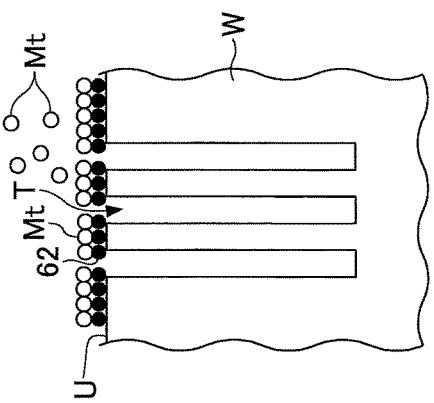
FIG. 9D is a second diagram illustrating an example of the oxidation process.

FIGS. 9C and 9D are diagrams illustrating an example of the oxidation process. As illustrated in FIG. 9C, the organic amino titanium gas adsorbed on the surface U of the wafer W is oxidized by molecules Mo of $H_2O_2$ gas in the second process area P2 after the wafer W passes through the separation area D. Further, as illustrated in FIG. 9D, a protective film 62 made of titanium oxide ($TiO_2$) is deposited on the surface U of the wafer W at the upper end of the trenches T.

In the nitriding process, FIGS. 9C and 9D are diagrams illustrating an example of the nitriding process. As illustrated in FIG. 9C, molecules Mo of $NH_3$ gas nitrides the organic amino titanium gas adsorbed on the surface U of the wafer W in the second process area P2 after the wafer W passes through the separation area D. Further, as illustrated in FIG. 9D, the protective film 62 made of titanium nitride (TiN) is deposited on the surface U of the wafer W at the upper end of the trenches T.

Figure 9E:
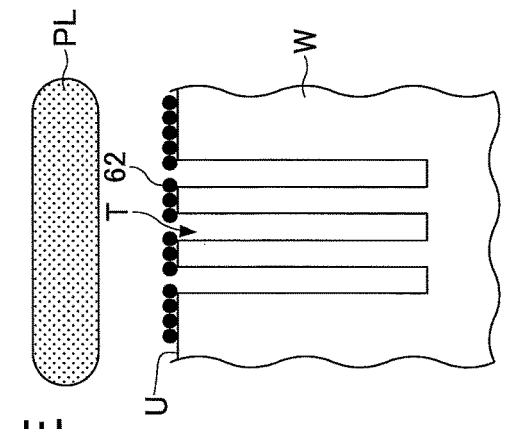
FIG. 9E is a diagram illustrating and example of a modification treatment process.

FIG. 9E is a diagram illustrating an example of plasma process (modification process). As illustrated in FIG. 9E, when the wafer W reaches the third process area P3 including the plasma generator 80, the wafer W is exposed to the oxygen plasma PL. Thus, the oxidation of the protective film 62 is accelerated, and film density of the protective film 62 increases, thereby improving the film quality of the protective film 62.

Figure 9F:
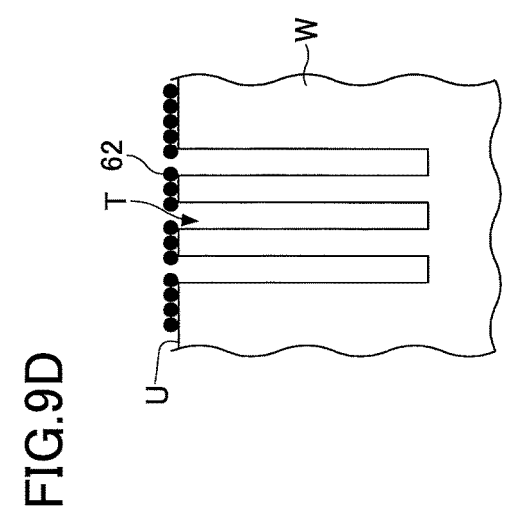
FIG. 9F is a diagram illustrating an example of the source gas adsorption process repeated again.

FIG. 9F is a diagram illustrating an example of the source gas adsorption process repeated again. As illustrated in FIG. 9F, when the wafer W reaches the first process area P1 again by the rotation of the turntable 2, the molecules Mt of the organic amino titanium gas supplied from the reaction gas nozzle 31 adsorb on the surface U of the wafer W. On this occasion, because diameters of the molecules Mt of the organic amino titanium are relatively large due to the organic groups attached to titanium and because the turntable 2 rotates at a high speed, the molecules Mt of the organic amino titanium do not reach the lower portion of the trenches T, and adsorb on and around the surface of the wafer W (around the top ends of the trenches T).

After that, substantially the same process is repeated while the turntable 2 continue to rotates at a high speed, and the $TiO_2$ film is deposited on the surface of the wafer W between the adjacent trenches T, thereby forming the protective film 62.

Thus, by supplying the organic metal gas having a large molecular diameter as the source gas from the reaction gas nozzle 31 while rotating the turntable 2, the film can be selectively deposited on the areas between the trenches T while preventing the progress of the film deposition in the trenches T, thereby forming regional protective films 62. In the present embodiment, the example of using the organic amino titanium as the source gas is cited, but because an organic metal gas generally has a large molecular diameter, the method for forming the protective film according to the present embodiment can be performed by using another kind of organic metal gas. Furthermore, the method for forming the protective film according to the present embodiment can be performed by using an organic semi-metal gas such as an organic silane gas in addition to the organic metal gas because the organic semi-metal gas such as the organic silane gas also has a large molecular diameter.

In this manner, because the organic metal gas and the organic semi-metal gas generally have large molecular diameters, the method for forming the protective film according to the present embodiment can be performed even if another organic metal gas or organic semi-metal gas is used. For example, an organic metal gas and the like used to deposit a high dielectric (high-k) film may be used as the source gas, and for example, Tris(dimethylamino)cyclopentadienylzirconium ($C_{11}H_{23}N_3Zr$) and the like may be used as the source gas. In addition, an organic metal gas obtained by evaporating an organic metal compound containing a metal such as aluminum, hafnium and titanium, or semi-metal such as silane, may be used as the source gas.

In general, the organic metal compound used as a source gas to deposit a High-k film is a compound containing an amine, and contains an amino group ($-NH_2$, $-NHR$, NRR'). For example, when the organic metal gas reacts with an oxidation gas and is oxidized, the amino group is released, thereby generating a harmful gas. Although the method for forming the protective film and the film deposition apparatus according to the present embodiment oxidizes the amino group well and performs a process of rendering the harmful gas harmless, this point is described later. The source gas is not limited to the above gases, but a variety of gases can be used.

FIG. 10 is a table illustrating examples of source gases to which the method for forming the protective film according to the embodiment of the present invention can be applied. In this manner, the protective film can be formed by using a variety of organic metal gases and organic semi-metal gases. Here, FIG. 10 only illustrates limited examples, and the method for forming the protective film according to the present embodiment can be implemented by using other organic metal gases and organic semi-metal gases.

The rotational speed of the turntable 2 is set at 90 to 300 rpm, but is influenced by a kind of the source gas. For example, when a protective film of $TiO_2$ is formed by using TDMAT, the rotational speed of the turntable 2 is preferably set in a range of 90 to 240 rpm, and more preferably in a range of 90 to 120 rpm.

Moreover, the rotational speed of the turntable 2 may be set in a range of 120 to 300 rpm, preferably in a range of 120 to 240 rpm, and optimally to a value of 180 rpm. In particular, as the rotational speed of the turntable 2 is set faster, the more preferably result is likely to be obtained in the nitriding process than in the oxidation process. Hence, the rotational speed of the turntable 2 may be set at 120 rpm or higher, for example, at 180 rpm, when a protective film of TiN is formed by using, for example, TDMAT.

Furthermore, when the organic semi-metal gas such as the organic silane gas is used as the source gas, the rotational speed of the turntable 2 is preferably set faster than that of the turntable 2 when the organic metal gas is used as the source gas. For example, when the organic semi-metal gas such as the organic silane gas is used as the source gas, the rotational speed of the turntable 2 is preferably set in a range of 150 to 300 rpm, and more preferably in a range of 180 to 300 rpm.

The rotational speed of the turntable 2 may be set at an appropriate value in a range of 90 rpm or higher depending on the source gas, the opening width of the trench T and/or hole formed in the surface of the wafer W and the like. At present, because a mechanical limitation of the rotational speed of the turntable 2 is 300 rpm, the rotational speed is described by setting 300 rpm as a maximum value. However, if the turntable 2 can be rotated faster than 300 rpm, for example, at 400 rpm, and 500 rpm, the rotational speed of the turntable 2 can be set faster than 300 rpm.

In addition, the pattern formed in the surface of the wafer W may be a pattern with a plurality of holes, or a pattern with a trench and a hole together other than the trenches. The protective film 62 can be formed on any surface area between recessed patterns.

In the above embodiments, the example of performing the thermal oxidation process in the oxidation process and then performing the plasma process (modification process) is described, but the plasma process is not necessarily required. Performing only the thermal oxidation process is possible. In this case, the process illustrated in FIG. 9E just has to be omitted.

Similarly, in the nitriding process, performing the thermal nitriding process in the nitriding process and then performing the plasma process (modification process) are possible, and performing on the thermal nitriding process by omitting the process in FIG. 9E is also possible.

In contrast, only the plasma treatment process may be performed so as to perform the oxidation process and the modification process together, without performing the thermal oxidation process. In this case, in the process in FIG. 9B, plasma illustrated in FIG. 9E is generated, thereby performing the oxidation process.

Similarly, even in the nitriding process, only the plasma treatment process may be performed so as to perform the oxidation process and the modification process together, without performing the thermal nitridation process. In this case, in the process in FIG. 9B, the plasma illustrated in FIG. 9E is generated, thereby performing the nitriding process.

Thus, there is a variety of choices with respect to the oxidation process and the plasma treatment process depending on the intended purpose.

Similarly, there is a variety of choices with respect to the nitriding process and the plasma treatment process depending on the intended purpose.

In the present embodiment, the example of the method for forming the protective film by using the film deposition apparatus with the turntable 2, but performing the method for forming the protective film according to the present embodiment without using the turntable 2 is possible. When using the turntable 2, a series of processes of the source gas adsorption process, the oxidation process, the plasma treatment process, the purge process between the source gas adsorption process and the oxidation process, the purge gas process between the plasma treatment process and the source gas adsorption process is performed one time every one rotation of the turntable 2. When the rotational speed of the turntable 2 is set at 120 rpm, the series of processes is 120 cycles per one minute. Similarly, for example, when the rotational speed of the turntable 2 is set at 90 rpm, the series of processes is 90 cycles per one minute. Hence, the supply of gas to the wafer W is switched at the same cycle (i.e., 120 cycles or 90 cycles, e.g.) per one minute as using the turntable 2, the method for forming the protective film according to the present embodiment can be performed without rotating the turntable 2.

Similarly, when using the turntable 2 in the nitriding process, a series of processes of the source gas adsorption process, the nitriding process, the plasma treatment process, the purge process between the source gas adsorption process and the nitriding process, the purge gas process between the plasma treatment process and the source gas adsorption process is performed one time every one rotation of the turntable 2. When the rotational speed of the turntable 2 is set at 120 rpm, the series of processes is 120 cycles per one minute. Similarly, for example, when the rotational speed of the turntable 2 is set at 90 rpm, the series of processes is 90 cycles per one minute. Hence, the supply of gas to the wafer W is switched at the same cycle (i.e., 120 cycles or 90 cycles, e.g.) as using the turntable 2, the method for forming the protective film according to the present embodiment can be performed without rotating the turntable 2.

WORKING EXAMPLES

Next, working examples of the embodiments of the present invention are described below.

FIG. 11A through 11D are views showing results of working examples of the method for forming the protective film according to the embodiments of the present invention together with results of a method for forming a protective film of comparative examples.

Figure 11A:
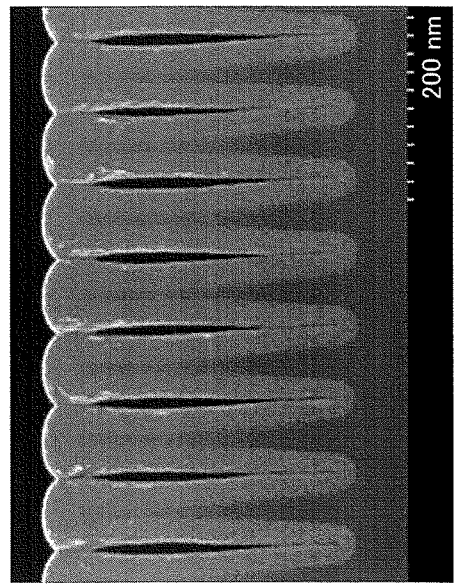
FIG. 11A is a view showing a result of performing a method for forming a protective film according to a comparative example 1.
Figure 11B:
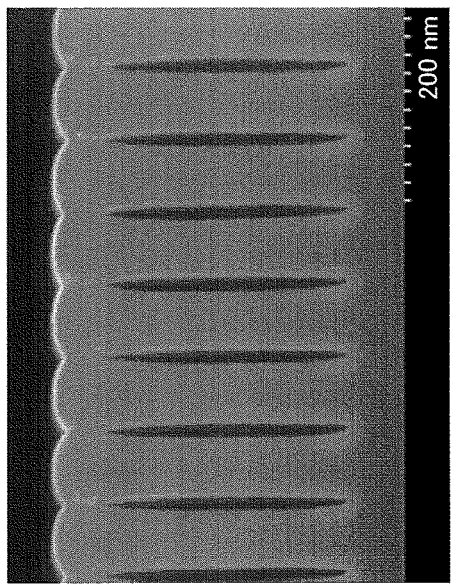
FIG. 11B is a view showing a result of performing a method for forming a protective film according to a comparative example 2.

FIGS. 11A and 11B are views showing the results of the method for forming the protective film of the comparative example. More specifically, TDMAT was used as a source gas, and $H_2O_2$ was used as an oxidation gas. The plasma generator 80 was not used. The temperature of the wafer W was set at 150 degrees C. The opening width of trenches was set at 50 nm.

FIG. 11A is a view showing the result of the method for forming the protective film of a comparative example 1 in which the turntable 2 is set at 30 rpm. As illustrated in FIG. 11A, films were deposited inside the trenches, and protective films were not deposited regionally in the comparative example 1.

FIG. 11B is a view showing the result of the method for forming the protective film of a comparative example 2 in which the rotational speed of the turntable 2 is set at 30 rpm. FIG. 11B indicated that films were deposited inside the trenches, and that protective films were not regionally deposited in the comparative example 2, similarly to the comparative example 1.

Figure 11C:
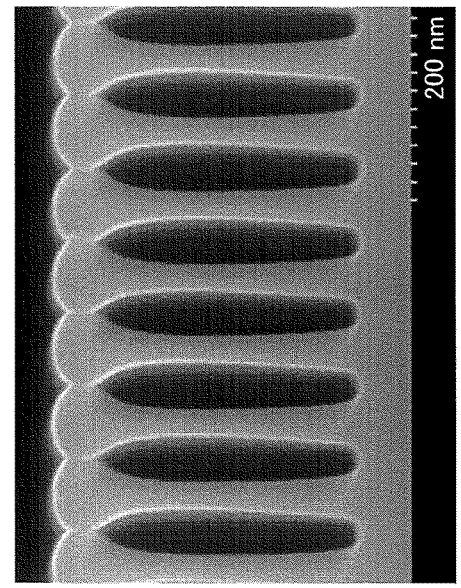
FIG. 11C is a view showing a result of performing a method for forming a protective film according to a working example 1.

FIG. 11C is a view showing the result of the method for forming the protective film of a working example 1 in which the rotational speed of the turntable 2 is set at 90 rpm. FIG. 11C indicated that films were hardly deposited inside the trenches, that films were deposited only on surfaces of the wafer between the trenches, and that mushroom-shaped protective films were formed thereon.

Figure 11D:
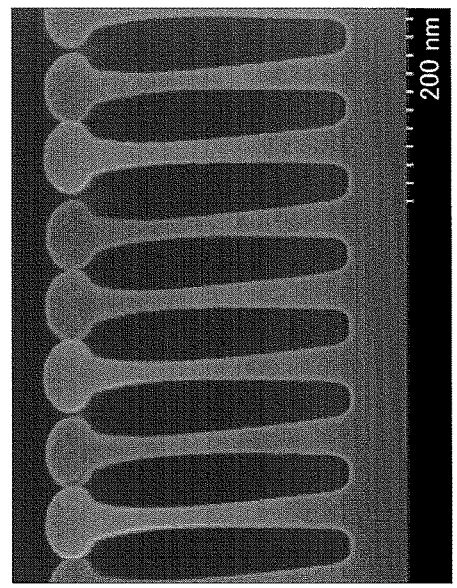
FIG. 11D is a view showing a result of performing a method for forming a protective film according to a working example 2.
Figure 12B:
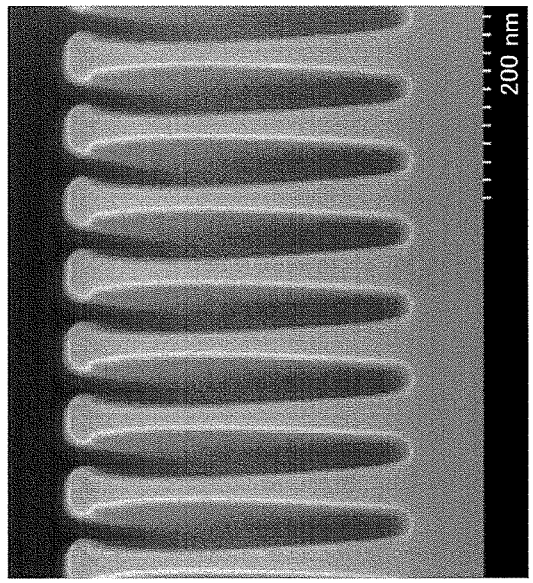
FIG. 12B is a view showing a result of performing the method for forming the protective film according to the working example 3 at 180 seconds from starting the film deposition.
Figure 12D:
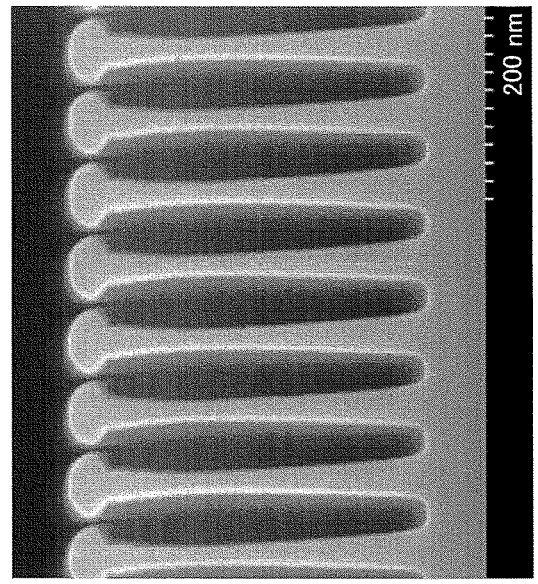
FIG. 12D is a view showing a result of performing the method for forming the protective film according to the working example 3 at 300 seconds from starting the film deposition.
Figure 12A:
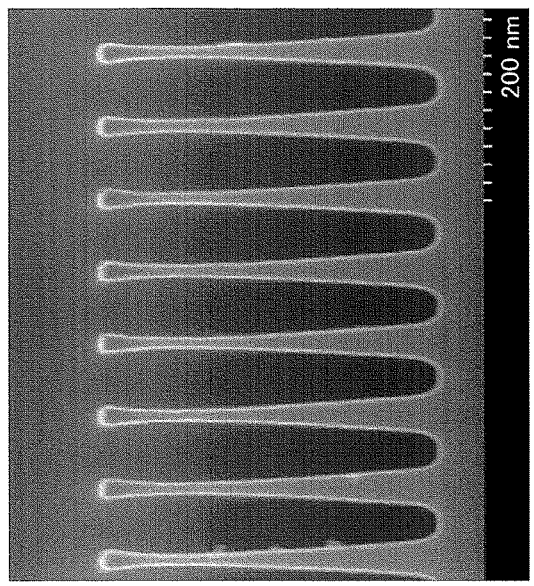
FIG. 12A is a view showing a result of performing a method for forming a protective film according to a working example 3 at zero seconds from starting film deposition.
Figure 12C:
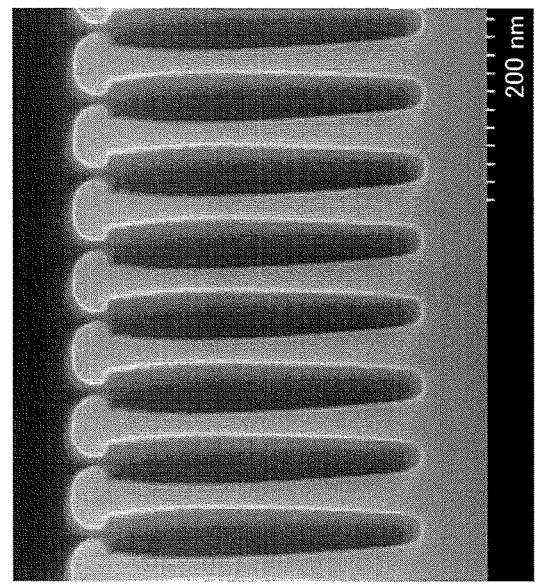
FIG. 12C is a view showing a result of performing the method for forming the protective film according to the working example 3 at 240 seconds from starting the film deposition.

FIG. 11D is a view showing the result of the method for forming the protective film of a working example 2 in which the rotational speed of the turntable 2 is set at 120 rpm. FIG. 11D indicated that films were hardly deposited inside the trenches; that films were deposited only on surfaces of the wafer between the trenches; and that cap-shaped protective films were deposited only on locations requiring the protective films. Thus, the results indicated that the protective films were formed more selectively and more regionally as the rotational speed of the turntable 2 became faster, as was true of the rotational speeds of 120 rpm and 90 rpm.

FIGS. 12A through 12E are views showing working results of a method for forming a protective film of a working example 3. In the working example 3, the rotational speed of the turntable 2 was set at 120 rpm, and variability of the protective film formation over time was observed when the rotational speed of the turntable 2 was set at 120 rpm and the plasma generator 80 was used.

FIGS. 12A, 12B, 12C, 12D, and 12E show states of film deposition at the elapse of 0 seconds, 180 seconds, 240 seconds, 300 seconds, and 360 seconds, respectively, from the start of the film deposition.

As shown in FIGS. 12A through 12E, only the films on areas of the surface of the wafer between trenches grew thick over time, without increasing the film thickness inside the trenches. Thus, the results in the working example 3 indicated that the method for forming the protective film according to the embodiments of the present invention was an excellent method for selectively forming a protective film.

Figure 13B:
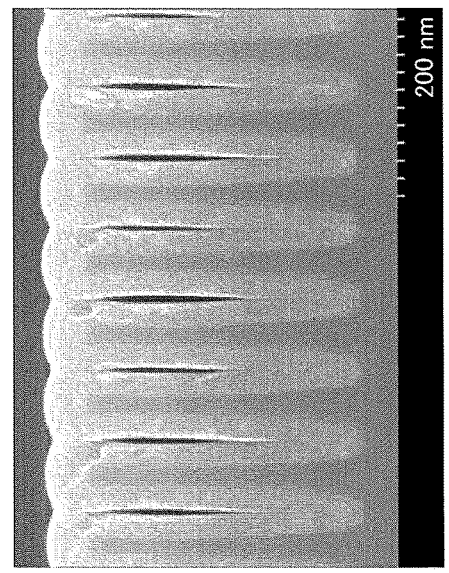
FIG. 13B is a view showing a result of performing a method for forming a protective film according to a comparative example 4.
Figure 12E:
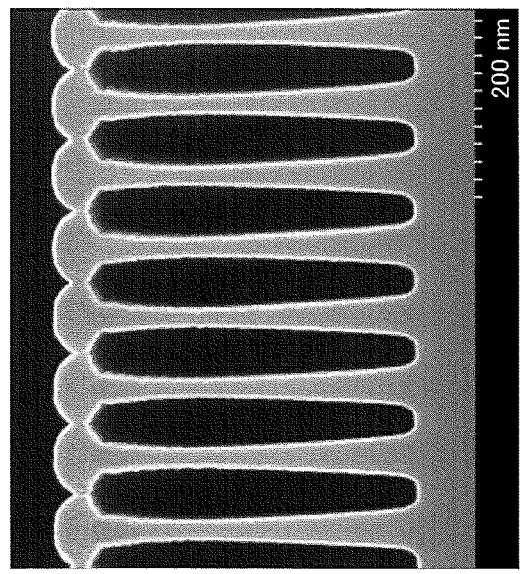
FIG. 12E is a view showing a result of performing the method for forming the protective film according to the working example 3 at 360 seconds from starting the film deposition.
Figure 13A:
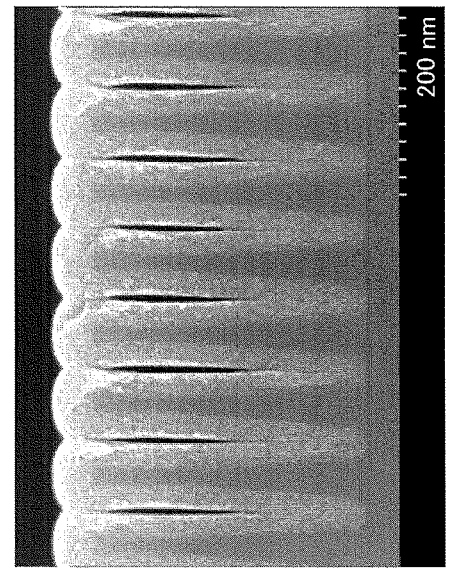
FIG. 13A is a view showing a result of performing a method for forming a protective film according to a comparative example 3.

FIGS. 13A and 13B are views showing results of methods for forming protective films of the comparative examples 3 and 4. In the comparative examples 3 and 4, film deposition was performed by using $TiCl_4$ as a source gas while changing the rotational speed of the turntable 2. $TiCl_4$ is a Ti-containing gas that is not an organic metal gas, and the molecular diameter is much smaller than that of the organic metal gas.

FIG. 13A is a view showing a result of the method for forming the protective film of the comparative example 3. In the comparative example 3, $TiCl_4$ was used as a source gas, and the rotational speed of the turntable 2 was set at a high speed of 120 rpm. In this case, as shown in FIG. 13A, films were deposited inside the trenches, and selective protective films were not formed.

FIG. 13B is a view showing a result of the method for forming the protective film of the comparative example 4. In the comparative example 4, $TiCl_4$ was used as a source gas, and the rotational speed of the turntable 2 was set at a low speed of 30 rpm. Even in this case, as shown in FIG. 13B, films were deposited inside the trenches, and selective protective films were not formed.

Thus, it is noted that an organic metal gas or an organic semi-metal gas needs to be used as a source gas to implement the method for forming the protective film according to the present embodiment of the present invention.

Figure 14B:
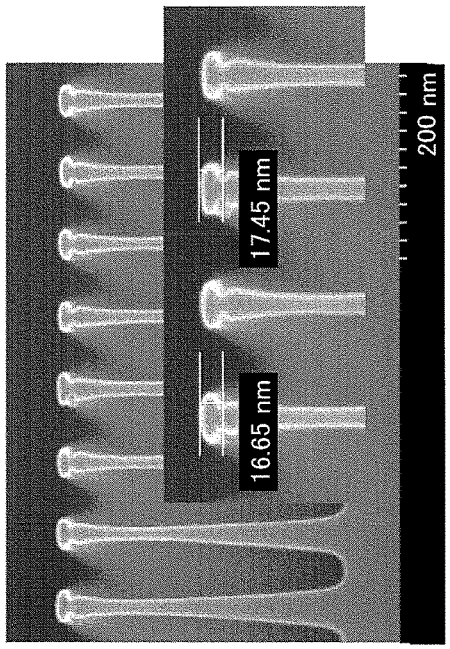
FIG. 14B is a view showing a result of performing the method for forming the protective film according to the working example 4 in a state after wet-etching the protective film.
Figure 14A:
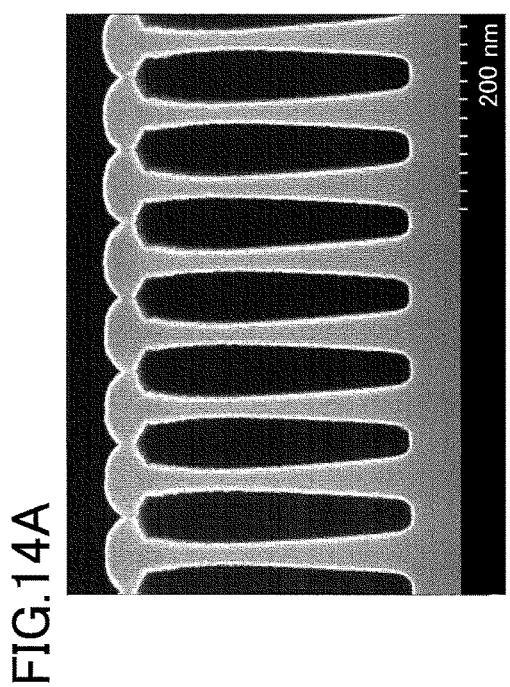
FIG. 14A is a view showing a result of performing a method for forming a protective film according to a working example 4 in a state of forming a protective film by film deposition.

FIGS. 14A and 14B are views showing results of a method for forming a protective film of a working example 4. In the working example 4, after forming protective films, wet etching was performed and the protective films after being subject to the wet etching were observed.

FIG. 14A is a view showing a state of protective films after formed by film deposition. In contrast, FIG. 14B is a view showing a state of the protective films after being subject to the wet etching. As shown by FIG. 14B, by performing the wet etching on the protective films, the sizes of the protective films can be made smaller, and the protective films can be provided only on areas where the protection is necessary.

In contrast, the state of FIG. 14A is a state in which air gaps whose tops are blocked are formed. When there is a demand for forming the air gaps in the future, the method can be applied to a method for forming an air gap.

Thus, the method for forming the protective film according to the embodiments of the present invention can be applied to a variety of fields where regional film deposition is necessary in the future in addition to the formation of the protective film.

Figure 15:
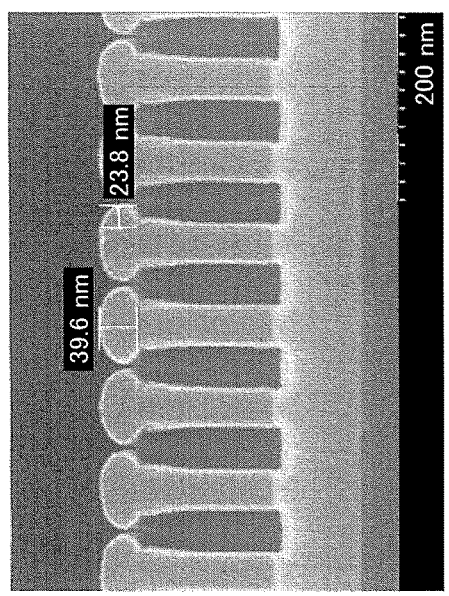
FIG. 15 is a view showing a result of performing a method for forming a protective film according to a working example 5.

FIG. 15 is a view showing a result of a method for forming a protective film of a working example 5. In the working example 5, TiN films were deposited above trench gaps by using TDMAT by a nitriding process.

With respect to the process conditions of the working example 5, the opening width of the trenches were 44 nm, and the pressure in the vacuum chamber 1 was set in a range of 1.4 to 1.8 Torr. TDMAT was used as a source gas, and $NH_3$ was used as a nitriding gas. The temperature of the wafer W was set at 200 degrees C., and the rotational speed of the turntable 2 was set at 180 rpm. The film deposition was performed for 7 to 10 minutes, and the film was deposited to 39.60 nm thick.

As a result, as shown in FIG. 15, cap-shaped protective films made of a TiN film were formed on the top end of the trenches (exactly areas between the trenches), and the thickness of the protective films was 23.8 nm. Thus, the working example 5 indicated that the protective films can be formed by a nitriding film.

As discussed above, according to the method for forming the protective film according to the embodiments of the present invention, a protective film can be regionally formed on an area between recessed shapes such as a trench structure or a hole structure.

All examples recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority or inferiority of the invention. Although the embodiments of the present invention have been described in detail, it should be understood that various changes, substitutions, and alterations could be made hereto without departing from the spirit and scope of the invention.

What is claimed is:

1. A method for forming a film, comprising steps of:
supplying a source gas containing an organic metal gas containing an amino group to a substrate having a plurality of recessed shapes and a flat area between the plurality of recessed shapes so as to cause the source gas to adsorb on the flat area between the plurality of recessed shapes;
supplying $H_2O_2$ gas to the substrate to oxidize the source gas adsorbed on the surface of the substrate by thermal oxidation, thereby depositing an oxidation film of an organic metal contained in the organic metal gas on the flat area between the plurality of recessed shapes,
wherein the steps of supplying the source gas to the substrate and supplying the oxidation gas to the substrate are repeated at a rate in a range of 90 to 300 cycles per minute such that the source gas adsorbs only on the flat area between the plurality of recessed shapes.

2. The method according to claim 1,
wherein the substrate is arranged on a turntable provided in a process chamber along a circumferential direction of the turntable,
wherein a source gas supply area for supplying the source gas to the substrate and an oxidation gas supply area for suppling the oxidation gas to the substrate are provided apart from each other in the circumferential direction of the turntable and above the turntable, and
wherein the steps of supplying the source gas to the substrate and supplying the oxidation gas to the substrate are repeated at the rate in the range of 90 to 300 cycles per minute by rotating the turntable at a rotational speed in a range of 90 to 300 rpm and by causing the substrate to sequentially pass through the source gas supply area and the oxidation gas supply area.

3. The method according to claim 2, wherein the turntable is rotated at a rotational speed in a range of 90 to 240 rpm.

4. The method according to claim 3, wherein the turntable is rotated at a rotational speed in a range of 90 to 120 rpm.

5. The method according to claim 1, wherein the organic metal gas is a gas capable of depositing a dielectric film.

6. The method according to claim 1, wherein the organic metal gas is a gas containing an organic amino titanium.

7. The method according to claim 1, wherein the gas containing the organic amino titanium is a gas containing tetrakis(dimethylamino)titanium.

8. The method according to claim 1, wherein the plurality recessed shapes includes trenches.

* * * * *